(12) United States Patent
Shin et al.

(10) Patent No.: US 12,414,372 B2
(45) Date of Patent: Sep. 9, 2025

(54) DISPLAY DEVICE AND TILED DISPLAY DEVICE INCLUDING THE SAME

(71) Applicant: Samsung Display Co., Ltd., Yongin-Si (KR)

(72) Inventors: Dong Hee Shin, Asan-si (KR); Sun Kwun Son, Suwon-si (KR); Na Hyeon Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/517,623

(22) Filed: Nov. 2, 2021

(65) Prior Publication Data

US 2022/0302175 A1 Sep. 22, 2022

(30) Foreign Application Priority Data

Mar. 16, 2021 (KR) .................. 10-2021-0033898

(51) Int. Cl.
  *G09G 3/32* (2016.01)
  *H01L 25/16* (2023.01)
  (Continued)

(52) U.S. Cl.
  CPC ............ *H10D 86/60* (2025.01); *G09G 3/32* (2013.01); *H01L 25/167* (2013.01); *H10D 86/441* (2025.01); *G09G 2300/026* (2013.01); *G09G 2300/0413* (2013.01); *G09G 2300/0421* (2013.01); *G09G 2310/0205* (2013.01);
  (Continued)

(58) Field of Classification Search
  CPC ... G09G 2310/0286; G09G 2300/0426; G09G 3/3266; G09G 2300/0408; G09G 2310/0267; G09G 2310/0281; G09G 2300/0413; G02F 1/136286; G09F 9/3023; H01L 27/156
  See application file for complete search history.

(56) References Cited

U.S. PATENT DOCUMENTS 8,471,981 B2 6/2013 Kim et al.
9,070,594 B2 6/2015 Im
(Continued)

FOREIGN PATENT DOCUMENTS

KR 10-2003-0095467 A 12/2003
KR 10-2012-0088971 A 8/2012
(Continued)

*Primary Examiner* — Md Saiful A Siddiqui
(74) *Attorney, Agent, or Firm* — Innovation Counsel LLP

(57) ABSTRACT

A display device may include a display panel and a scan driving unit. The display panel may include a display area and a non-display. The display area may include scan lines, data lines, and pixels connected to the scan lines and the data lines. The non-display area may abut the display area and may include data connection lines. The data connection lines may be respectively connected to the data lines. The scan driving unit may include scan stages and auxiliary stages. The scan stages may be disposed on the display area and may be electrically connected to the scan lines for providing scan signals through the scan lines to the pixels. The auxiliary stages may be disposed on the non-display area, may include auxiliary transistors, and may provide carry signals to one or more of the scan stages. Some of the auxiliary transistors overlap the data connection lines.

17 Claims, 20 Drawing Sheets

(51) Int. Cl.
    *H01L 27/12*         (2006.01)
    *H10D 86/40*         (2025.01)
    *H10D 86/60*         (2025.01)
    *H01L 23/00*         (2006.01)
    *H01L 25/065*         (2023.01)

(52) U.S. Cl.
    CPC ............... *G09G 2310/0267* (2013.01); *G09G 2310/0275* (2013.01); *G09G 2310/08* (2013.01); *H01L 24/32* (2013.01); *H01L 25/0655* (2013.01); *H01L 25/162* (2013.01); *H01L 2224/32137* (2013.01)

(56) References Cited

U.S. PATENT DOCUMENTS

| | | | |
|---|---|---|---|
| 9,305,508 B2 | 4/2016 | Park et al. | |
| 9,495,932 B2 | 11/2016 | Park et al. | |
| 10,043,478 B2 | 8/2018 | Im | |
| 10,777,159 B2 | 9/2020 | Takeuchi et al. | |
| 2003/0227433 A1* | 12/2003 | Moon | G09G 3/3677 345/100 |
| 2005/0134318 A1* | 6/2005 | Baude | H02M 7/217 363/125 |
| 2006/0044215 A1* | 3/2006 | Brody | G09G 3/3208 345/1.3 |
| 2009/0322649 A1* | 12/2009 | Hamer | G09G 3/2085 345/1.3 |
| 2010/0277440 A1* | 11/2010 | Cok | H10K 59/129 345/204 |
| 2013/0321499 A1* | 12/2013 | Park | G09G 3/3275 345/698 |
| 2014/0028534 A1* | 1/2014 | Park | G09G 3/20 345/84 |
| 2015/0008438 A1* | 1/2015 | Im | H01L 27/124 257/72 |
| 2015/0115292 A1* | 4/2015 | Jeon | H01L 27/124 257/88 |
| 2015/0293546 A1* | 10/2015 | Tanaka | G02F 1/13454 327/541 |
| 2015/0310821 A1* | 10/2015 | Kim | G09G 3/3677 345/212 |
| 2016/0267831 A1* | 9/2016 | Seo | G09G 3/2085 |
| 2017/0047032 A1* | 2/2017 | Nishiyama | G09G 3/3677 |
| 2017/0178586 A1* | 6/2017 | Kim | G09G 3/003 |
| 2017/0193939 A1* | 7/2017 | Lee | G09G 3/20 |
| 2017/0287381 A1* | 10/2017 | Park | G02F 1/133512 |
| 2017/0287387 A1* | 10/2017 | Eguchi | G09G 3/3413 |
| 2018/0068629 A1* | 3/2018 | Shin | G02F 1/13454 |
| 2018/0107041 A1* | 4/2018 | Hayashi | G02F 1/136286 |
| 2018/0108309 A1* | 4/2018 | Tanaka | G09G 3/3648 |
| 2018/0166467 A1 | 6/2018 | Lai et al. | |
| 2019/0096864 A1* | 3/2019 | Huitema | H01L 21/6835 |
| 2019/0237489 A1* | 8/2019 | Matsukizono | G09G 3/3674 |
| 2019/0347985 A1* | 11/2019 | Shaeffer | H10K 59/17 |
| 2019/0378463 A1* | 12/2019 | Chung | G09G 3/3225 |
| 2020/0333391 A1* | 10/2020 | Park | G09G 3/3266 |
| 2021/0217339 A1* | 7/2021 | Zheng | G09G 3/2092 |
| 2021/0217353 A1* | 7/2021 | Zhao | G09G 3/32 |

FOREIGN PATENT DOCUMENTS

| | | |
|---|---|---|
| KR | 10-2014-0015777 A | 2/2014 |
| KR | 10-2015-0005105 A | 1/2015 |
| KR | 10-2016-0079977 A | 7/2016 |
| KR | 2019-0036447 A | 4/2019 |

* cited by examiner

DISPLAY DEVICE AND TILED DISPLAY DEVICE INCLUDING THE SAME

CROSS-REFERENCE TO RELATED APPLICATION

This application claims priority to Korean Patent Application No. 10-2021-0033898 filed on Mar. 16, 2021; the Korean Patent Application is incorporated by reference.

BACKGROUND

1. Field

The technical field relates to a display device and a tiled display device including the display device.

2. Description of the Related Art

A display device may display images according to input signals. Display devices have been applied to various electronic devices, such as smart phones, digital cameras, notebook computers, navigation systems, and smart televisions (TVs). Modern display devices include liquid crystal display (LCD) devices, field emission display (FED) devices, and organic light-emitting display devices.

A tiled display device can be implemented by connecting multiple display devices to form a large screen. The tiled display device may include a seam between adjacent display devices. If the seam is too wide, an image displayed by the tiled display device may appear disconnected.

SUMMARY

Embodiments may be related to a display device and a tiled display device capable of displaying images that appear seamless.

According to an embodiment, a display device includes a display panel including a display area, which includes scan lines, data lines, and pixels connected to the scan lines and the data lines, and a non-display area, which includes fan-out lines connected to the data lines, and a scan driving unit configured to output scan signals to the scan lines. The scan driving unit includes a plurality of stages, which are disposed in the display area, are connected to the scan lines, and output the scan signals, and dummy stages, which are disposed in the non-display area and output carry signals to the stages. Each of the dummy stages includes at least one dummy transistor. The at least one dummy transistor overlaps with one of the fan-out lines.

The at least one dummy transistor may include a dummy gate electrode, which intersects the fan-out lines.

The dummy gate electrode and the scan lines may extend in a first direction. The fan-out lines and the data lines may extend in a second direction.

The at least one dummy transistor may include a dummy source electrode, which is connected to a dummy source connecting line through a dummy source contact hole, and a dummy drain electrode, which is connected to a dummy drain connecting line through a dummy drain contact hole.

The dummy source connecting line, the dummy drain connecting line, and the scan lines may extend in a first direction. The fan-out lines and the data lines may extend in a second direction.

The at least one dummy transistor may further include a dummy active layer, which overlaps with the dummy gate electrode and is disposed between the dummy source electrode and the drain electrode.

The fan-out lines may overlap with the dummy active layer, the dummy source electrode, and the dummy drain electrode.

The display device may further comprise a circuit board disposed on a first side of the display panel, and a source driving circuit disposed on the circuit board. The dummy stages may be disposed closer than the stages to the circuit board.

The source driving circuit may apply a start signal to a stage closest to a second side of the display panel that is opposite to the first side of the display panel.

The stages may sequentially output scan signals, starting from the stage closest to a second side of the display panel that is opposite to the first side of the display panel to the stage closest to the first side of the display panel.

Each of the stages may include a first scan transistor, which outputs a first clock signal applied to a clock terminal to one of the scan lines in accordance with a voltage of a first node, and a first scan capacitor, which is disposed between a gate electrode and a source electrode of the first scan transistor.

The first scan transistor may be disposed between a pair of adjacent pixels in a first direction. The first scan capacitor may be disposed between another pair of adjacent pixels in the first direction.

The first scan transistor and the first scan capacitor may be arranged in a second direction intersecting the first direction.

The first direction may be a direction in which the scan lines extend. The second direction may be a direction in which the data lines extend.

According to an embodiment of the disclosure, a display device includes a display panel including a display area, which includes scan lines, data lines, and pixels connected to the scan lines and the data lines, and a non-display area, which includes fan-out lines connected to the data lines, a scan driving unit configured to output scan signals to the scan lines, a circuit board disposed on a first side of the display panel; and a source driving circuit disposed on the circuit board. The scan driving unit includes a plurality of stages, which are disposed in the display area, are connected to the scan lines, and output the scan signals, and dummy stages, which are disposed in the non-display area and output carry signals to the stages. The dummy stages are disposed closer than the stages to the circuit board.

The source driving circuit may apply a start signal to the stage closest to a second side of the display panel that is opposite to the first side of the display panel.

The stages may sequentially output scan signals, starting from the stage closest to a second side of the display panel that is opposite to the first side of the display panel to the stage closest to the first side of the display panel.

Each of the dummy stages may include at least one dummy transistor. The at least one dummy transistor may overlap with one of the fan-out lines.

The at least one dummy transistor may include a dummy gate electrode, which intersects the fan-out lines.

According to another embodiment, a tiled display device includes a plurality of display devices, and a seam disposed between the display devices. Each of the display devices includes a display panel including a display area, which includes scan lines, data lines, and pixels connected to the scan lines and the data lines, and a non-display area, which includes fan-out lines connected to the data lines, and a scan driving unit configured to output scan signals to the scan lines, the scan driving unit includes a plurality of stages, which are disposed in the display area, are connected to the scan lines, and output the scan signals, and dummy stages, which are disposed in the non-display area and output carry signals to the stages, each of the dummy stages includes at least one dummy transistor, and the at least one dummy transistor overlaps with one of the fan-out lines.

An embodiment may be related to a display device. The display device may include a display panel and a scan driving unit. The display panel may include a display area and a non-display. The display area may include scan lines, data lines, and pixels electrically connected to the scan lines and the data lines. The non-display area may abut the display area and may include data connection lines. The data connection lines may be respectively electrically connected to the data lines. The scan driving unit may include scan stages and auxiliary stages. The scan stages may be disposed on the display area and may be electrically connected to the scan lines for providing scan signals through the scan lines to the pixels. The auxiliary stages may be disposed on the non-display area, may include auxiliary transistors, and may provide carry signals to one or more of the scan stages. Some of the auxiliary transistors overlap the data connection lines.

The auxiliary transistors may share an auxiliary gate electrode. The auxiliary gate electrode may intersect the data connection lines.

The auxiliary gate electrode and the scan lines may extend lengthwise in a first direction. The data connection lines may extend lengthwise in a second direction different from the first direction.

The display device may include an auxiliary source connecting line and an auxiliary drain connecting line. The auxiliary transistors may include auxiliary source electrodes and auxiliary drain electrodes. The auxiliary source electrodes may be spaced from each other and may be connected to the auxiliary source connecting line through auxiliary source contact holes. The auxiliary drain electrodes may be spaced from each other and may be connected to the auxiliary drain connecting line through auxiliary drain contact holes.

The auxiliary source connecting line, the auxiliary drain connecting line, and the scan lines may extend lengthwise in a first direction. The data connection lines may extend lengthwise in a second direction different from the first direction.

The auxiliary transistors may include auxiliary channels. The auxiliary channels overlap the auxiliary gate electrode and may be disposed between the auxiliary source electrodes and the auxiliary drain electrodes.

The data connection lines overlap some of the auxiliary channels, some of the auxiliary source electrodes, and some of the auxiliary drain electrodes.

The display device may include the following elements: a circuit board overlapping a first edge of the display panel; and a source driving circuit disposed on the circuit board. The auxiliary stages may be disposed between the scan stages and the circuit board.

The source driving circuit may apply a start signal to a first scan stage among the scan stages. The first scan stage may be positioned closer to a second edge of the display panel than all other scan stages of the scan driving unit. The second edge of the display panel may be opposite the first edge of the display panel.

The scan stages may sequentially output the scan signals, starting from the first scan stage.

Each of the scan stages may include a first scan transistor, a clock terminal, a first node, and a first scan capacitor. The clock terminal receives a first clock signal. The first scan transistor outputs the first clock signal to one of the scan lines in accordance with a voltage of a first node. The first scan capacitor may be disposed between a gate electrode of the first scan transistor and a source electrode of the first scan transistor.

The first scan transistor of a first scan stage among the scan stages may be disposed between two adjacent pixels in a first direction. The first scan capacitor of a second scan stage among the scan stages may be disposed between other two adjacent pixels in the first direction.

The first scan transistor of the first scan stage may be aligned with the first scan capacitor of the second scan stage in a second direction different from the first direction.

The scan lines may extend lengthwise in the first direction. The data lines may extend lengthwise in the second direction.

An embodiment may be related to a display device. The display device may include a display panel, a scan driving unit, a circuit board, and a source driving circuit. The display panel may include a display area and a non-display area. The display area may include scan lines, data lines, and pixels electrically connected to the scan lines and the data lines. The non-display area abuts the display area and may include data connection lines, and wherein the data connection lines may be respectively electrically connected to the data lines. The scan driving unit may include scan stages and auxiliary stages. The circuit board may overlap a first edge of the display panel. The source driving circuit may be disposed on the circuit board. The scan stages may be disposed on the display area and may be electrically connected to the scan lines for providing scan signals through the scan lines to the pixels. The auxiliary stages may be disposed on the non-display area and may provide carry signals to one or more of the scan stages. The auxiliary stages may be disposed closer to the circuit board than the scan stages.

The source driving circuit may apply a start signal to a first scan stage among the scan stages. The first scan stage may be positioned closer to a second edge of the display panel than all other scan stages of the scan driving unit. The second edge of the display panel may be opposite the first edge of the display panel.

The scan stages may sequentially output the scan signals, starting from the first scan stage.

The auxiliary stages may include auxiliary transistors. Some of the auxiliary transistors may overlap the data connection lines.

The auxiliary transistors may share an auxiliary gate electrode. The auxiliary gate electrode may intersect the data connection lines.

An embodiment may be related to a tiled display device. The tiled display device may include display devices and seams disposed between the display devices. Each of the display devices may include a display panel and a scan driving unit. The display panel may include a display area and a non-display area. The display area may include scan lines, data lines, and pixels electrically connected to the scan lines and the data lines. The non-display area abuts the display area and may include data connection lines. The data connection lines may be respectively electrically connected to the data lines. The scan driving unit may include scan stages and auxiliary stages. The scan stages may be disposed on the display area and may be connected to the scan lines for providing scan signals through the scan lines to the pixels. The auxiliary stages may be disposed on the non-display area, may include auxiliary transistors, and may be for providing carry signals to one or more of the scan stages, and wherein some of the auxiliary transistors overlap the data connection lines.

According to embodiments, as dummy stages and circuit boards are disposed on same non-display areas, the distances between display areas of adjacent display devices can be minimized. Advantageously, images displayed by adjacent display devices may appear seamlessly connected.

DETAILED DESCRIPTION

Figure 1:
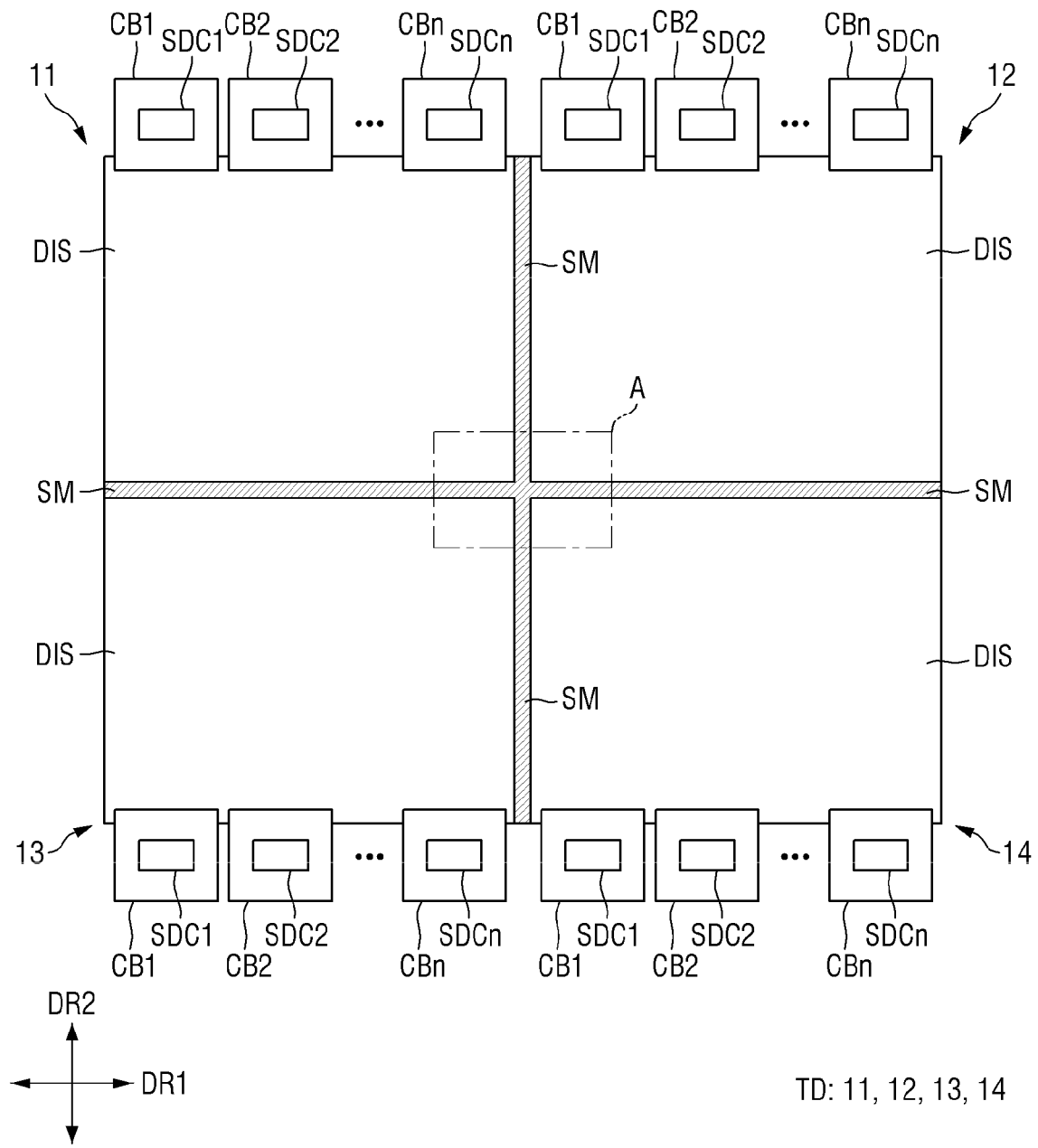
FIG. 1 is a plan view of a tiled display device according to an embodiment.

Embodiments are described with reference to the accompanying drawings. Practical embodiments may be embodied in many different forms. Like reference numerals may refer to like elements.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

When a first element is referred to as being "on" a second element, the first element can be directly on the second element, or one or more intervening elements may also be present between the first element and the second element. When a first element is referred to as being "directly on" a second element, there are no intended intervening elements present between the first element and the second element.

The singular forms "a," "an," and "the" may also indicate plural forms, unless the content clearly indicates otherwise.

Relative terms, such as "lower," "bottom," "upper," and/or "top," may be used to describe one element's relationship to one or more other elements as illustrated in the Figures. The relative terms may be adjusted according to different orientations of the device. For example, if the device in one of the figures is turned over, a first element described as being on the "lower" side relative to a second element would then be oriented on an "upper" side relative to the second element.

The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The term "the same" may mean "equal." The term "fan-out line" may mean "connection line." The term "contact" may mean "directly contact" or "direct contact." The term "dummy" may mean "auxiliary" or "supplemental." The expression that an element extends in a particular direction may mean that the lengthwise direction of the element is in the particular direction.

Cross-sectional views may be schematic illustrations of idealized embodiments.

Variations from the illustrated shapes (e.g., as a result of manufacturing techniques and/or tolerances) are to be expected. A region illustrated as flat may have rough and/or nonlinear features. Illustrated sharp angles may be rounded.

FIG. 1 is a plan view of a tiled display device according to an embodiment.

Referring to FIG. 1, a tiled display device TD may include display devices 11, 12, 13, and 14).

The first through fourth display devices 11 through 14 may be arranged in an array. The first and second display devices 11 and 12 may be arranged in a first direction DR1, the first and third display devices 11 and 13 may be arranged in a second direction DR2, the third and fourth display devices 13 and 14 may be arranged in the first direction DR1, and the second and fourth display devices 12 and 14 may be arranged in the second direction DR2.

At least one of the first through fourth display devices 11 through 14 may be located at one or more corners of the tiled display device TD. At least one of the first through fourth display devices 11 through 14 may be surrounded by the other display devices. The number and arrangement of display devices included in the tiled display device TD may be configured according to embodiments. The number and arrangement of the display devices in the tiled display device TD may be determined based on the size(s) and shape(s) of the display devices and the size and the shape of the tiled display device TD.

The tiled display device TD may have a planar shape. The tiled display device TD may have a stereoscopic shape and may thus provide a sense of depth to a user. The tiled display device TD has a stereoscopic shape, and at least one of the first through fourth display devices 11 through 14 may have a curved shape. The tiled display device TD may have a stereoscopic shape, and the display devices 11 through 14 may have a planar shape and may be connected at predetermined angles.

The tiled display device TD may include at least one seam SM between the display devices 11 through 14. Seams SM may be positioned between the first and second display devices 11 and 12, between the first and third display devices 11 and 13, between the second and fourth display devices 12 and 14, and between the third and fourth display devices 13 and 14.

A seam SM may include a bonding member or an adhesive member. The display devices 11 through 14 may be connected to one another via the bonding member or the adhesive member of the seam SM.

The display devices 11, 12, 13, and 14 and the seams SM may have the same reflectance or similar reflectance values for external light. Thus, the seams SM can be inconspicuous to the user when the display devices 11, 12, 13, and 14 are not displaying images in the tiled display device TD. Even though the seams SM exist, images displayed by the display devices 11, 12, 13, and 14 can appear seamless and can provide a satisfactory experience to the viewer.

Each of the display devices 11 through 14 may include a display panel DIS, a plurality of circuit boards circuit boards CB1, B2 through CBn (where n is an integer of 3 or greater), and a plurality of source driving circuits SDC1, SDC2 through SDCn.

All of the display panels DIS of the display devices 11 through 14 may have the same size. Some of the display panels DIS of the display devices 11 through 14 may have different sizes.

The display panels DIS of the display devices 11 through 14 may have a rectangular shape having long sides and short sides. The right short side of the display panel DIS of the first display device 11 and the left short side of the display panel DIS of the second display device 12 may be connected by a first seam SM. The lower long side of the display panel DIS of the first display device 11 and the upper long side of the display panel DIS of the third display device 13 may be connected by a second seam SM. The lower long side of the display panel DIS of the second display device 12 and the upper long side of the display panel DIS of the fourth display device 14 may be connected by a third seam SM. The right short side of the display panel DIS of the third display device 13 and the left short side of the display panel DIS of the fourth display device 14 may be connected by a fourth seam SM.

In each of the display devices 11 through 14, the circuit boards CB1, CB2, . . . , CBn may be disposed on one side of the display panel DIS. In each of the first and second display devices 11 and 12, the circuit boards CB1, CB2, . . . , CBn may be disposed on the upper side of the display panel DIS. In each of the third and fourth display devices 13 and 14, the circuit boards CB1, CB2, . . . , CBn may be disposed on the lower side of the display panel DIS.

In each of the display devices 11 through 14, the circuit boards CB1, CB2, . . . , CBn may be attached to pads disposed on one side of the display panel DIS via conductive adhesive members such as anisotropic conductive films. As a result, in each of the display devices 11 through 14, the circuit boards CB1, CB2, . . . , CBn may be electrically connected to the display panel DIS. The circuit boards CB1, CB2, . . . , CBn of each of the display devices 11 through 14 may be flexible films, chip-on-films, flexible printed circuit boards, or printed circuit boards.

In each of the display devices 11 through 14, the source driving circuits SDC1, SDC2, . . . , SDCn may correspond to the circuit boards CB1, CB2, . . . , CBn. In each of the display devices 11 through 14, the first source driving circuit SDC1 may be disposed on the first circuit board CB1, the second source driving circuit SDC2 may be disposed on the second circuit board CB2, and the n-th source driving circuit SDCn may be disposed on the n-th circuit board CBn. The source driving circuits SDC1, SDC2, . . . , SDCn may be integrated circuits. The source driving circuits SDC1, SDC2, . . . , SDCn may be attached to the circuit boards CB1, CB2, . . . , CBn via conductive adhesive members, such as anisotropic conductive films.

In each of the display devices 11 through 14, the source driving circuits SDC1, SDC2, . . . , SDCn may receive digital video data, may generate data voltages based on the digital video data, and may output the data voltages to data lines of the display panel DIS.

Figure 2A:
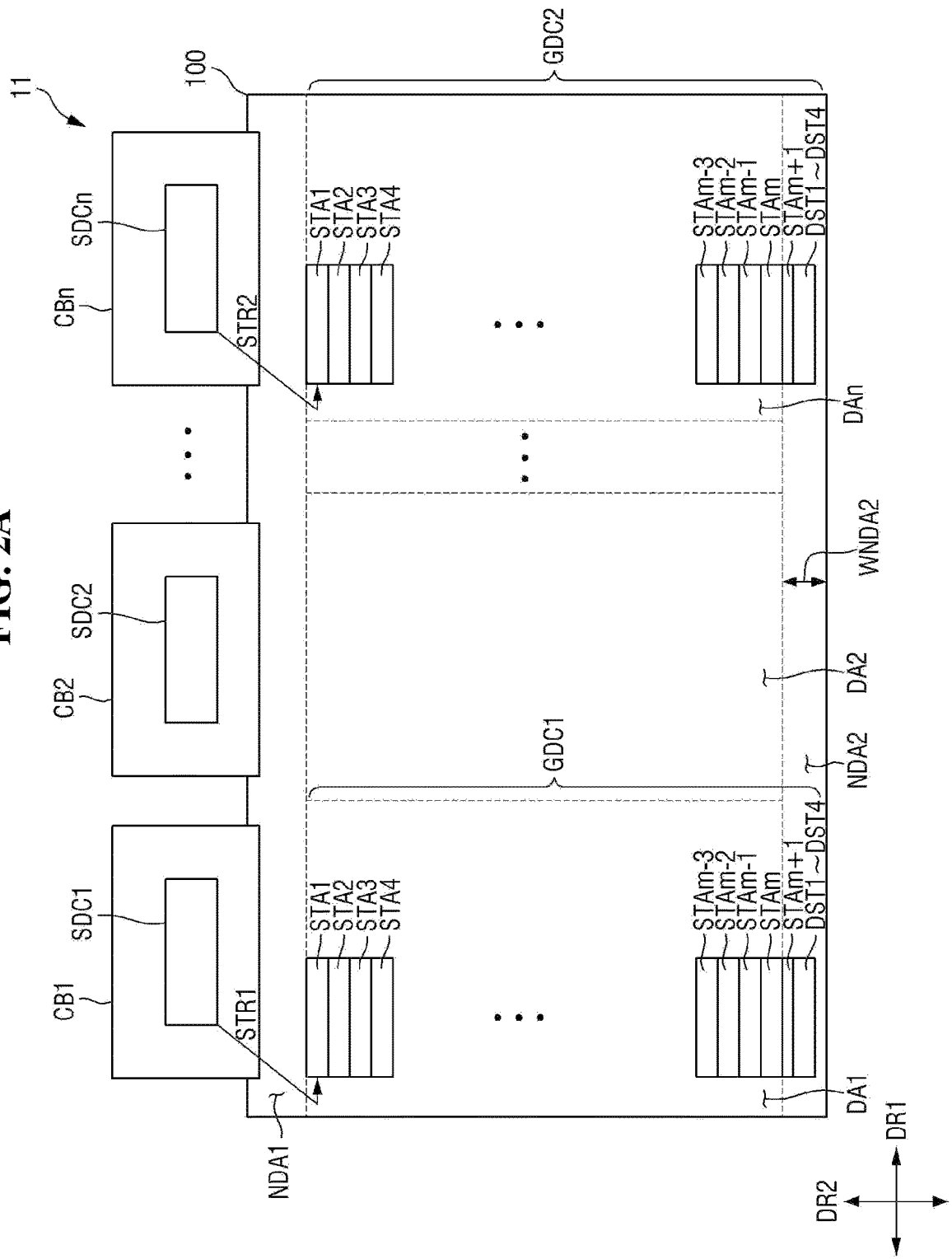
FIG. 2A is a layout view of a first display device according to an embodiment.

FIG. 2A is a layout view of a first display device according to an embodiment.

Referring to FIG. 2A, a first display device 11 may include a display panel DIS, circuit boards CB1, CB2, . . . , CBn, source driving circuits SDC1, SDC2, . . . , SDCn, and scan driving circuits GDC1 and GDC2. The display panel DIS may include display areas DA1, DA2, . . . , DAn and non-display areas NDA1 and NDA2.

The first display area DA1 may include data lines connected to the first source driving circuit SDC1 through the first circuit board CB1. The data lines of the first display area DA1 may receive data voltages from the first source driving circuit SDC1. Accordingly, the first pixels PX1 of the first display area DA1 (shown in FIG. 2B) may receive data voltages from the first source driving circuit SDC1 and may thus be able to display an image.

The second display area DA2 may include data lines connected to the second source driving circuit SDC2 through the second circuit board CB2. The data lines of the second display area DA2 may receive data voltages from the second source driving circuit SDC2. Accordingly, the first pixels PX1 of the second display area DA2 may receive data voltages from the second source driving circuit SDC2 and may thus be able to display an image.

The n-th display area DAn may include data lines connected to the n-th source driving circuit SDCn through the n-th circuit board CBn. The data lines of the n-th display area DAn may receive data voltages from the n-th source driving circuit SDCn. Accordingly, the first pixels PX1 of the n-th display area DAn may receive data voltages from the n-th source driving circuit SDCn and may thus be able to display an image.

The first non-display area NDA1 may be disposed at an upper part of the display panel DIS. The first through n-th circuit boards CB1 through CBn may (partially) overlap the first non-display area NDA1. The first through n-th circuit boards CB1 through CBn may be attached to pads disposed in the first non-display area NDA1 through conductive adhesive members, such as anisotropic conductive films.

The second non-display area NDA2 may be disposed at a lower part of the display panel DIS. Part of each of the scan driving circuits GDC1 and GDC2 may be disposed in the second non-display area NDA2.

The scan driving circuits GDC1 and GDC2 are disposed in the first and n-th display areas DA1 and DAn, respectively.

The first scan driving circuit GDC1 may receive first scan control signals from the first source driving circuit SDC1. The first scan control signals may include a first start signal STR1, a first clock signal, and a first clock bar signal. The first start signal STR1 may indicate the output of a first scan signal. The first clock signal and the first clock bar signal may have opposite phases. When the first clock signal has a first-level voltage, the first clock bar signal may have a second-level voltage. When the first clock signal has the second-level voltage, the first clock bar signal may have the first-level voltage.

The first scan driving circuit GDC1 may be disposed in part of the first display area DA1. The first scan driving circuit GDC1 may be disposed in a left part of the first display area DA1, as illustrated in FIG. 2A. The first scan driving circuit GDC1 may be disposed in a right part of the first display area DA1 or in the middle of the first display area DA1.

The second scan driving circuit GDC2 may receive second scan control signals from the n-th source driving circuit SDCn. The second scan control signals may include a second start signal STR2, a second clock signal, and a second clock bar signal. The second start signal STR2 may indicate the output of a second scan signal. The second clock signal and the second clock bar signal may have opposite phases. When the second clock signal has the first-level voltage, the second clock bar signal may have the second-level voltage. When the second clock signal has the second-level voltage, the second clock bar signal may have the first-level voltage. The second clock signal may be synchronized with the first clock signal, and the second clock bar signal may be synchronized with the first clock bar signal. Therefore, scan signals of the second scan driving circuit GDC2 may be synchronized with scan signals of the first scan driving circuit GDC1.

The second scan driving circuit GDC2 may be disposed in part of the n-th display area DAn. The second scan driving circuit GDC2 may be disposed in a left part of the n-th display area DAn, as illustrated in FIG. 2A. The second scan driving circuit GDC2 may be disposed in a right part of the n-th display area DAn or in the middle of the n-th display area DAn.

Each of the first and second scan driving circuits GDC1 and GDC2 may include stages (or scan stages) STA1, STA2, STA3 through STAm−3, STAm−2, STAm−1, STAm, STAm+1, and dummy stages (or auxiliary stages) DST1 through DST4. The first through (m+1)-th stages STA1 through STAm+1 and the first through fourth stages DST1 through DST4 may extend in the first direction DR1 and may be arranged in the second direction DR2. The first through (m+1)-th stages STA1 through STAm+1 and the first through fourth stages DST1 through DST4 may be sequentially arranged from the upper side to the lower side of the display panel DIS. The first stage STA1 may be disposed on/near the uppermost side of the display panel DIS, and the (m+1)-th stage STAm+1 may be disposed on/near the lowermost side of the display panel DIS. The first through fourth dummy stages DST1 through DST4 may be disposed below the (m+1)-th stage STAm+1.

The first through (m+1)-th stages STA1 through STAm+1 may generate scan signals in accordance with scan control signals from the first source driving circuit SDC1. The first through (m+1)-th stages STA1 through STAm+1 may be connected to scan lines and may sequentially output scan signals to the scan lines.

The first through fourth dummy stages DST1 through DST4 may generate carry signals in accordance with scan control signals from the first source driving circuit SDC1. The first through fourth dummy stages DST1 through DST4 do not output scan signals.

The first start signal STR1 may be provided to the first stage STA1 of the first scan driving circuit GDC1. As a result, the first through (m+1)-th stages STA1 through STAm+1 of the first scan driving circuit GDC1 may sequentially output scan signals.

The second start signal STR2 may be provided to the first stage STA1 of the second scan driving circuit SDC2. As a result, the first through (m+1)-th stages STA1 through STAm+1 of the second scan driving circuit GDC2 may sequentially output scan signals.

The scan signals of the first scan driving circuit GDC1 may be synchronized with the scan signals of the second scan driving circuit GDC2. The scan signal of the first stage STA1 of the first scan driving circuit GDC1 may be substantially the same as the scan signal of the first stage STA1 of the second scan driving circuit GDC2. The scan signal of the second stage STA2 of the first scan driving circuit GDC2 may be substantially the same as the scan signal of the second stage STA2 of the second scan driving circuit GDC2. The scan signal of the third stage STA3 of the first scan driving circuit GDC2 may be substantially the same as the scan signal of the third stage STA3 of the second scan driving circuit GDC2. The scan signal of the fourth stage STA4 of the first scan driving circuit GDC2 may be substantially the same as the scan signal of the fourth stage STA4 of the second scan driving circuit GDC2. The scan signal of the (m−3)-th stage STAm−3 of the first scan driving circuit GDC2 may be substantially the same as the scan signal of the (m−3)-th stage STAm−3 of the second scan driving circuit GDC2. The scan signal of the (m−2)-th stage STAm−2 of the first scan driving circuit GDC2 may be substantially the same as the scan signal of the (m−2)-th stage STAm−2 of the second scan driving circuit GDC2. The scan signal of the (m−1)-th stage STAm−1 of the first scan driving circuit GDC2 may be substantially the same as the scan signal of the (m−1)-th stage STAm−1 of the second scan driving circuit GDC2. The scan signal of the m-th stage STAm of the first scan driving circuit GDC2 may be substantially the same as the scan signal of the m-th stage STAm of the second scan driving circuit GDC2. The scan signal of the (m+1)-th stage STAm+1 of the first scan driving circuit GDC2 may be substantially the same as the scan signal of the (m+1)-th stage STAm+1 of the second scan driving circuit GDC2.

The first scan driving circuit GDC1 may be disposed in the first display area DA1, the second scan driving circuit GDC2 may be disposed in the n-th display area DAn, and the scan signals of the first scan driving circuit GDC1 may be synchronized with the scan signals of the second scan driving circuit GDC2. Even if the size of the display panel DIS increases, RC delays in scan signals can be minimized.

Each of the first and second scan driving circuits GDC1 and GDC2 may include dummy stages DST1 through DST4. The first through fourth dummy stages DST1 through DST4 may reset the last four stages, i.e., the (m−2)-th, (m−1)-th, m-th, and (m+1)-th stages STAm−2, STAm−1, STAm, and STAm+1.

The first stage STA1 of the first scan driving circuit GDC1, to which the first start signal STR1 is provided, may be disposed at the top of the first scan driving circuit GDC1. That is, the first stage STA1 of the first scan driving circuit GDC1 may be disposed closer than the other stages of the first scan driving circuit GDC1 to the first circuit board CB1. The first through fourth dummy stages DST1 through DST4 of the first scan driving circuit GDC1 may be disposed at the bottom of the first scan driving circuit GDC1. That is, the first through fourth dummy stages DST1 through DST4 of the first scan driving circuit GDC1 may be disposed farther than the other stages of the first scan driving circuit GDC1 from the first circuit board CB1.

The first stage STA1 of the second scan driving circuit GDC2, to which the second start signal STR2 is provided, may be disposed at the top of the second scan driving circuit GDC2. That is, the first stage STA1 of the second scan driving circuit GDC2 may be disposed closer than the other stages of the second scan driving circuit GDC2 to the n-th circuit board CBn. The first through fourth dummy stages DST1 through DST4 of the second scan driving circuit GDC2 may be disposed at the bottom of the second scan driving circuit GDC2. That is, the first through fourth dummy stages DST1 through DST4 of the second scan driving circuit is GDC2 may be disposed farther than the other stages of the second scan driving circuit GDC2 from the n-th circuit board CBn.

The first through m-th stages STA1 through STAm of the first scan driving circuit GDC1 may be disposed in the first display area DA1, and the first through m-th stages STA1 through STAm of the second scan driving circuit GDC2 may be disposed in the n-th display area DAn. The (m+1)-th stage STAm+1 and the first through fourth dummy stages DST1 through DST4 of each of the first and second scan driving circuits GDC1 and GDC2 may not be disposed in the first or n-th display area DA1 or DAn. The (m+1)-th stage STAm+1 and the first through fourth dummy stages DST1 through DST4 of each of the first and second scan driving circuits GDC1 and GDC2 may be disposed in the first non-display area NDA1 and the second non-display area NDA2, respectively. The (m+1)-th stage STAm+1 of the first scan driving circuit GDC1 may be disposed in the first display area DA1, and the (m+1)-th stage STAm+1 of the second scan driving circuit GDC2 may be disposed in the n-th display area DAn.

Due to the presence of the (m+1)-th stage STAm+1 and the first through fourth dummy stages DST1 through DST4 of each of the first and second scan driving circuits GDC1 and GDC2, a width WNDA2 of the second non-display area NDA2 in the second direction DR2 may be significant. If the minimum distance between pixels disposed along the lower side of the display panel DIS of the first display device 11 and pixels disposed on the upper side of the display panel of a third display device 13 (illustrated in FIG. 1) is significantly large, an image displayed by the first display device 11 and an image displayed by the third display device may appear disconnected (and spaced) from each other by the corresponding seam SM. If the minimum distance between pixels disposed along the lower side of the display panel of a second display device 12 (illustrated in FIG. 1) and pixels disposed on the upper side of the display panel of a fourth display device 14 (illustrated in FIG. 1) is significantly large, an image displayed by the second display device and an image displayed by the fourth display device may appear disconnected (and spaced) from each other by the corresponding seam SM.

Figure 2B:
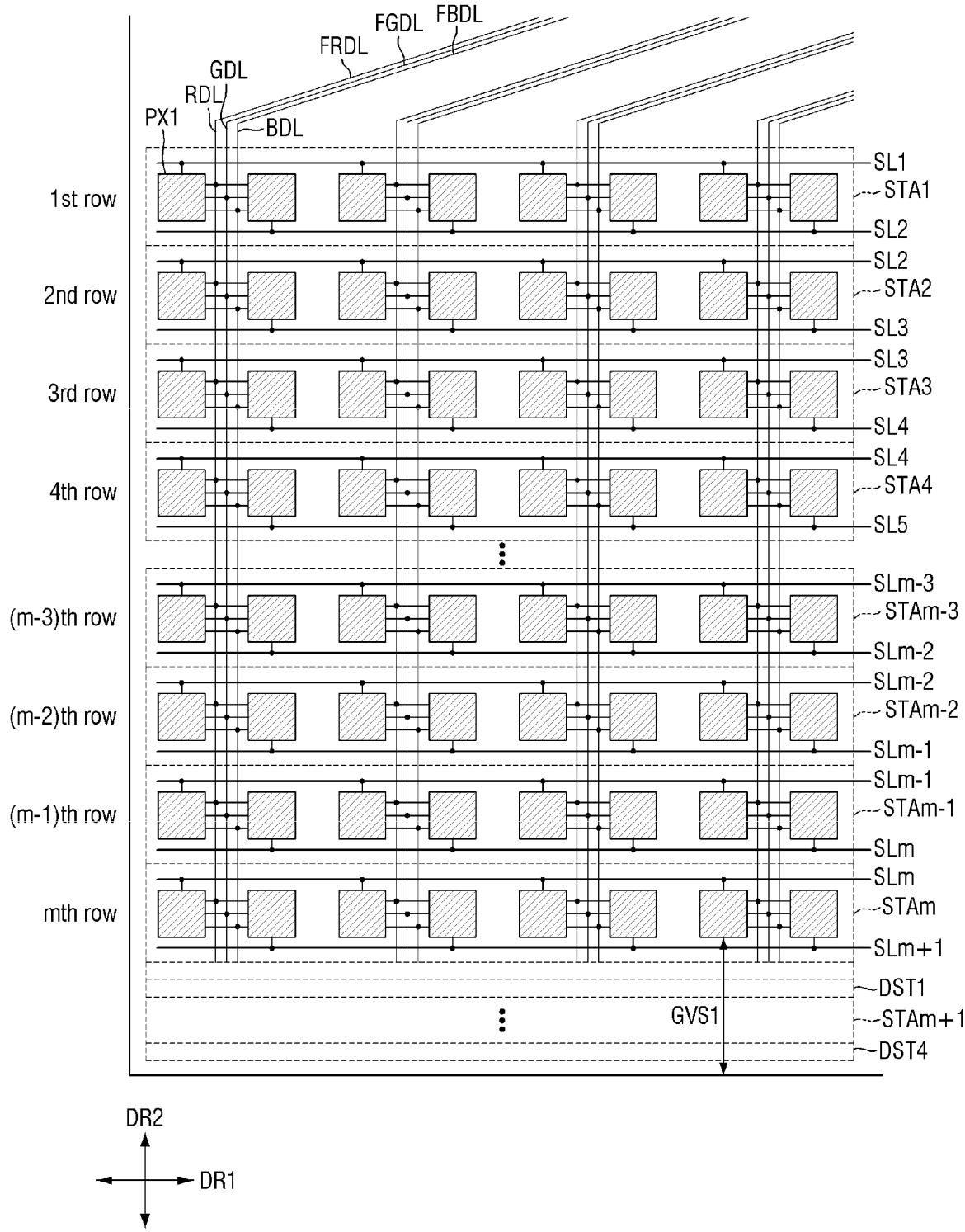
FIG. 2B is a layout view illustrating pixels, stages, and dummy stages in a first display area of FIG. 2A according to an embodiment.

FIG. 2B is a layout view illustrating pixels, stages, and dummy stages in the first display area of FIG. 2A.

Referring to FIG. 2B, scan lines (SL1, SL2, etc.), data lines (RDL, GDL, and BDL), and first pixels PX1 may be disposed in the first display area DA1.

The scan lines SL1, SL2, etc. may extend in the first direction DR1 and may be arranged in the second direction DR2. The data lines (RDL, GDL, and BDL) may extend in the second direction DR2 and may be arranged in the first direction DR1.

Each of the first pixels PX1 may include a plurality of subpixels. Each of the first pixels PX1 may include three subpixels SPX1, SPX2, and SPX3 (see FIG. 8). Each of the first pixels PX1 may be connected to one of first through (m+1)-th scan lines SL1 through SLm+1 and may be connected to red, green, and blue data lines RDL, GDL, and BDL. The first subpixel SPX1 may be connected to one of the first through (m+1)-th scan lines SL1 through SLm+1 and the red data line RDL. The second subpixel SPX2 may be connected to one of the first through (m+1)-th scan lines SL1 through SLm+1 and the green data line GDL. The third subpixel SPX3 may be connected to one of the first through (m+1)-th scan lines SL1 through SLm+1 and the blue data line BDL.

Every two adjacent first pixels PX1 in the first direction DR1 may be connected to different scan lines and may be connected to the same data lines RDL, GDL, and BDL. Two adjacent first pixels PX1 in the first row may be connected to different scan lines, i.e., the first and second scan lines SL1 and SL2. One of the two adjacent first pixels PX1 may receive data voltages from data lines (RDL, GDL, and BDL) disposed between the two adjacent first pixels PX1 in response to a scan signal being applied to the first scan line SL1, and the other first pixel PX1 may receive data voltages from the data lines (RDL, GDL, and BDL) in response to a scan signal being applied to the second scan line SL2.

Each of the first through (m+1)-th stages STA1 through STAm+1 may be connected to one of the first through (m+1)-th scan lines SL1 through SLm+1 and may output a scan signal.

The first through m-th stages STA1 through STAm may be arranged in first through m-th rows, respectively. Elements of the first through m-th stages STA1 through STAm may be disposed near, but may not overlap with, first pixels PX1 in their respective rows.

Referring to FIGS. 2B, 3B, 5, 6, and 7, elements of the first stage STA1 (analogous to elements of the m-th stage STAm) may be disposed near first pixels PX1 in the first row (analogous to the m-th row). The first stage STA1 may be connected to the first scan line SL1 and may output a scan signal. Elements of the first stage STA1 may not overlap with the first pixels PX1 in the first row. The scan transistor GT1, the capacitor GC1, the clock signal input unit CKT, the clock bar signal input unit CBT, and the reset signal input unit RT of the first stage STA1 may be disposed between first pixels PX1 in the first direction DR1, between first pixels PX1 and second pixels PX2 (illustrated in FIG. 4) in the second direction DR2, and/or beyond first pixels PX1 in the second direction DR2.

The second through (m+1)-th stages STA2 through STAm+1 are analogous to the first stage STA1.

No first pixels PX1 are arranged in the (m+1)-th row, but the (m+1)-th stage STAm+1, which is connected to the (m+1)-th scan line SLm+1 and outputs a scan signal, is essential because the (m+1)-th scan line SLm+1 is needed. The first through fourth dummy stages DST1 through DST4 are essential to reset the (m−2)-th, (m−1)-th, m-th, and (m+1)-th stages STAm−2, STAm−1, STAm, and STAm+1, respectively.

The (m+1)-th stage STAm+1 and the first through fourth dummy stages DST1 through DST4 may be disposed below the m-th stage STAm. The (m+1)-th stage STAm+1 may be disposed below first pixels PX1 of the m-th row. As the (m+1)-th stage STAm+1 and the first through fourth dummy stages DST1 through DST4 are disposed in the second non-display area NDA2, elements of the (m+1)-th stage STAm+1 and the first through fourth dummy stages DST1 through DST4 do not need to be disposed around first pixels PX1. Thus, the widths of the (m+1)-th stage STAm+1 and the first through fourth dummy stages DST1 through DST4 may be smaller than the widths of the first through m-th stages STA1 through STAm in the second direction DR2.

Due to the presence of the (m+1)-th stage STAm+1 and the first through fourth dummy stages DST1 through DST4, the distance GVS1 between the first pixels PX1 of the m-th row and the closest edge of the display panel DIS may be significant, and the distance between first pixels PX1 of the first display device 11 and third pixels PX3 of a third display device 13 (illustrated in FIG. 4) may be significant. Thus, images displayed by the first and third display devices 11 and 13 may appear disconnected (and spaced).

Figure 3A:
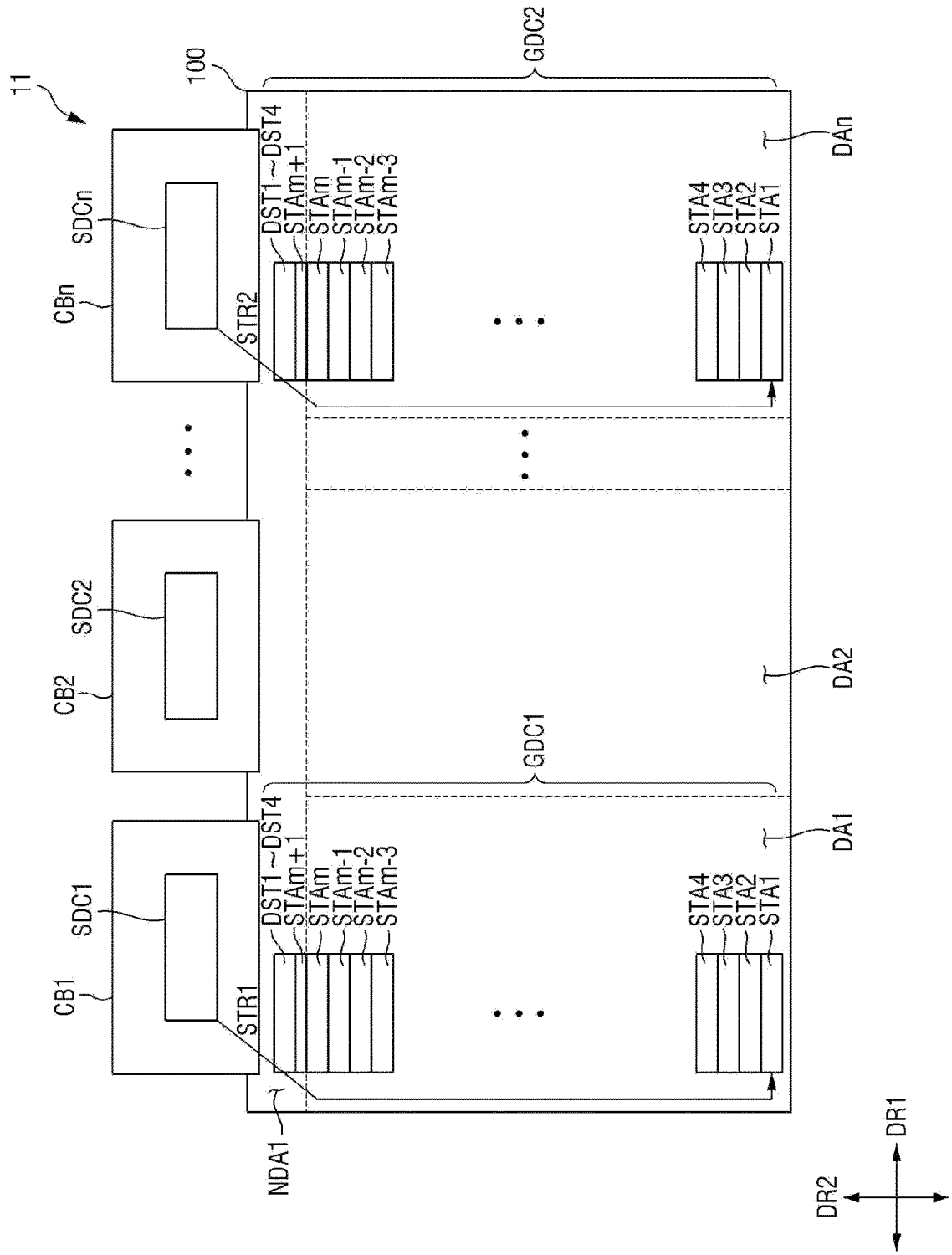
FIG. 3A is a layout view of a first display device according to an embodiment.
Figure 3B:
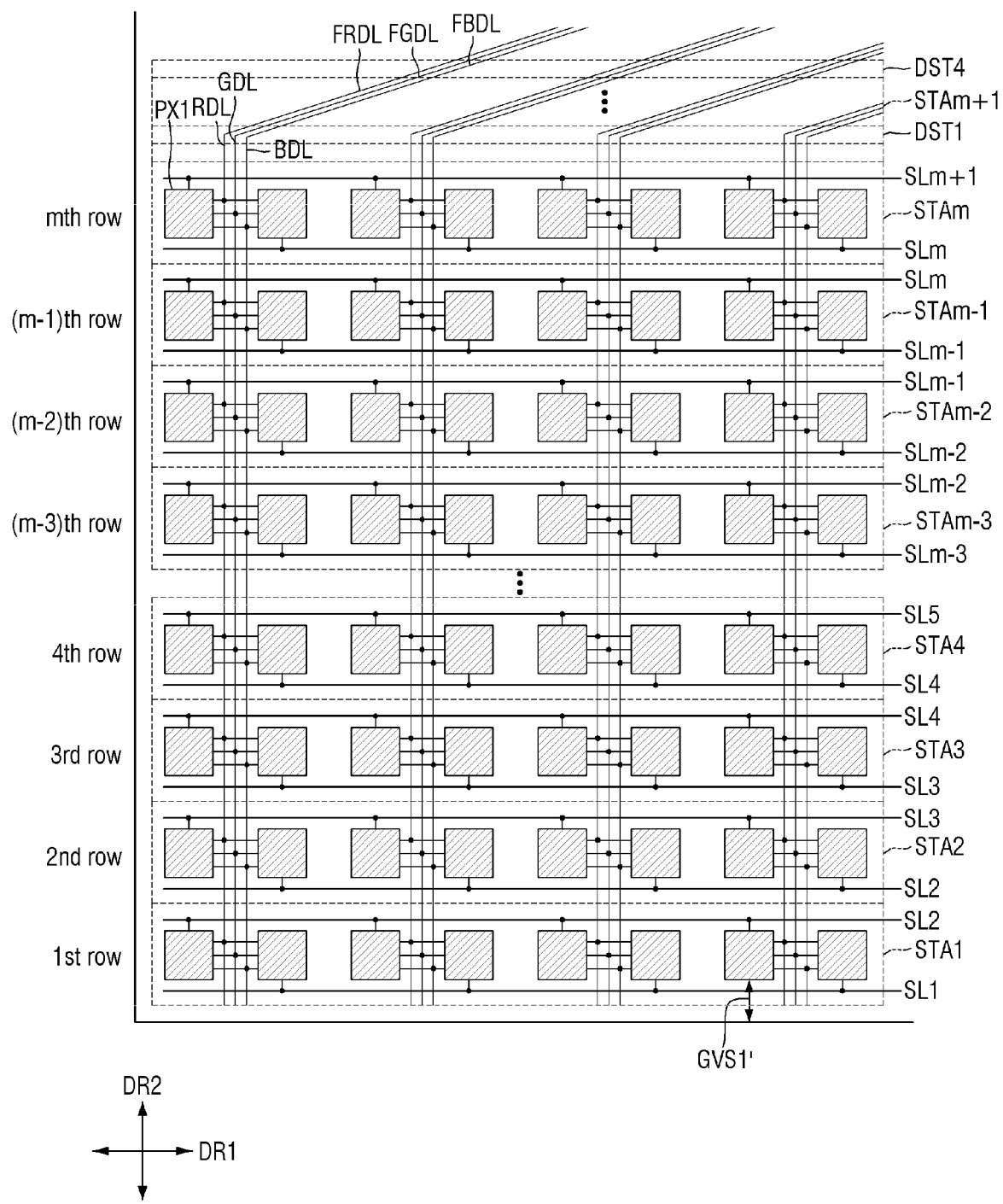
FIG. 3B is a layout view illustrating pixels, stages, and dummy stages in a first display area of FIG. 3A according to an embodiment.

FIG. 3A is a layout view of a first display device according to an embodiment. FIG. 3B is a layout view illustrating pixels, stages, and dummy stages in a first display area of FIG. 3A according to an embodiment.

FIGS. 3A and 3B differ from FIGS. 2A and 2B in that dummy stages DST1 through DST4 are disposed in a first non-display area NDA1.

Referring to FIGS. 3A and 3B, first through (m+1)-th stages STA1 through STAm+1 and the first through fourth dummy stages DST1 through DST4 may be sequentially arranged in the second direction DR2 from the lower side to the upper side of a display panel DIS. Among the stages STA1 through STAm+1, the first stage STA1 may be disposed closest to the lowermost side of the display panel DIS, and the (m+1)-th stage STAm+1 may be disposed closest to the uppermost side of the display panel DIS. The first through fourth dummy stages DST1 through DST4 may be disposed above the (m+1)-th stage STAm+1.

The first stage STA1 of a first scan driving circuit GDC1, to which a first start signal STR1 is provided, may be disposed at the bottom of the first scan driving circuit GDC1. That is, the first stage STA1 of the first scan driving circuit GDC1 may be disposed farther than the other stages of the first scan driving circuit GDC1 from a first circuit board CB1. The first through fourth dummy stages DST1 through DST4 of the first scan driving circuit GDC1 may be disposed at the top of the first scan driving circuit GDC1. That is, the first through fourth dummy stages DST1 through DST4 of the first scan driving circuit GDC1 may be disposed closer than the other stages of the first scan driving circuit GDC1 to the first circuit board CB1.

The first stage STA1 of a second scan driving circuit GDC2, to which a second start signal STR2 is provided, may be disposed at the bottom of the second scan driving circuit GDC2. That is, the first stage STA1 of the second scan driving circuit GDC2 may be disposed farther than the other stages of the second scan driving circuit GDC2 from an n-th circuit board CBn. The first through fourth dummy stages DST1 through DST4 of the second scan driving circuit GDC2 may be disposed at the top of the second scan driving circuit GDC2. That is, the first through fourth dummy stages DST1 through DST4 of the second scan driving circuit GDC2 may be disposed closer than the other stages of the second scan driving circuit GDC2 to the n-th circuit board CBn.

No first pixels PX1 are arranged in an (m+1)-th row, but the (m+1)-th stage STAm+1, which is connected to the (m+1)-th scan line SLm+1 and outputs a scan signal, is essential because the (m+1)-th scan line SLm+1 is needed. The first through fourth dummy stages DST1 through DST4 are essential to reset the (m−2)-th, (m−1)-th, m-th, and (m+1)-th stages STAm−2, STAm−1, STAm, and STAm+1, respectively.

The (m+1)-th stage STAm+1 and the first through fourth dummy stages DST1 through DST4 may be disposed above the m-th stage STAm. That is, the (m+1)-th stage STAm+1 may be disposed above first pixels PX1 of the m-th row. As the (m+1)-th stage STAm+1 and the first through fourth dummy stages DST1 through DST4 are disposed in the first non-display area NDA1, elements of the (m+1)-th stage STAm+1 and the first through fourth dummy stages DST1 through DST4 do not need to be disposed around first pixels PX1. Thus, the widths of the (m+1)-th stage STAm+1 and the first through fourth dummy stages DST1 through DST4 may be smaller than the widths of the first through m-th stages STA1 through STAm in the second direction DR2. Since the (m+1)-th stage STAm+1 and the first through fourth dummy stages DST1 through DST4 are disposed in the first non-display area NDA1, no second non-display area NDA2 may be provided. Accordingly, a distance GVS1 between first pixels PX1 of the first row and the closest edge of the display panel DIS may be minimized. Therefore, the minimum distance between pixels of the first display device 11 and pixels of a third display device 13 (illustrated in FIG. 4) can be minimized. Advantageously, an image displayed by the first display device 11 and an image displayed by the third display device can appear seamlessly connected to each other.

Figure 4:
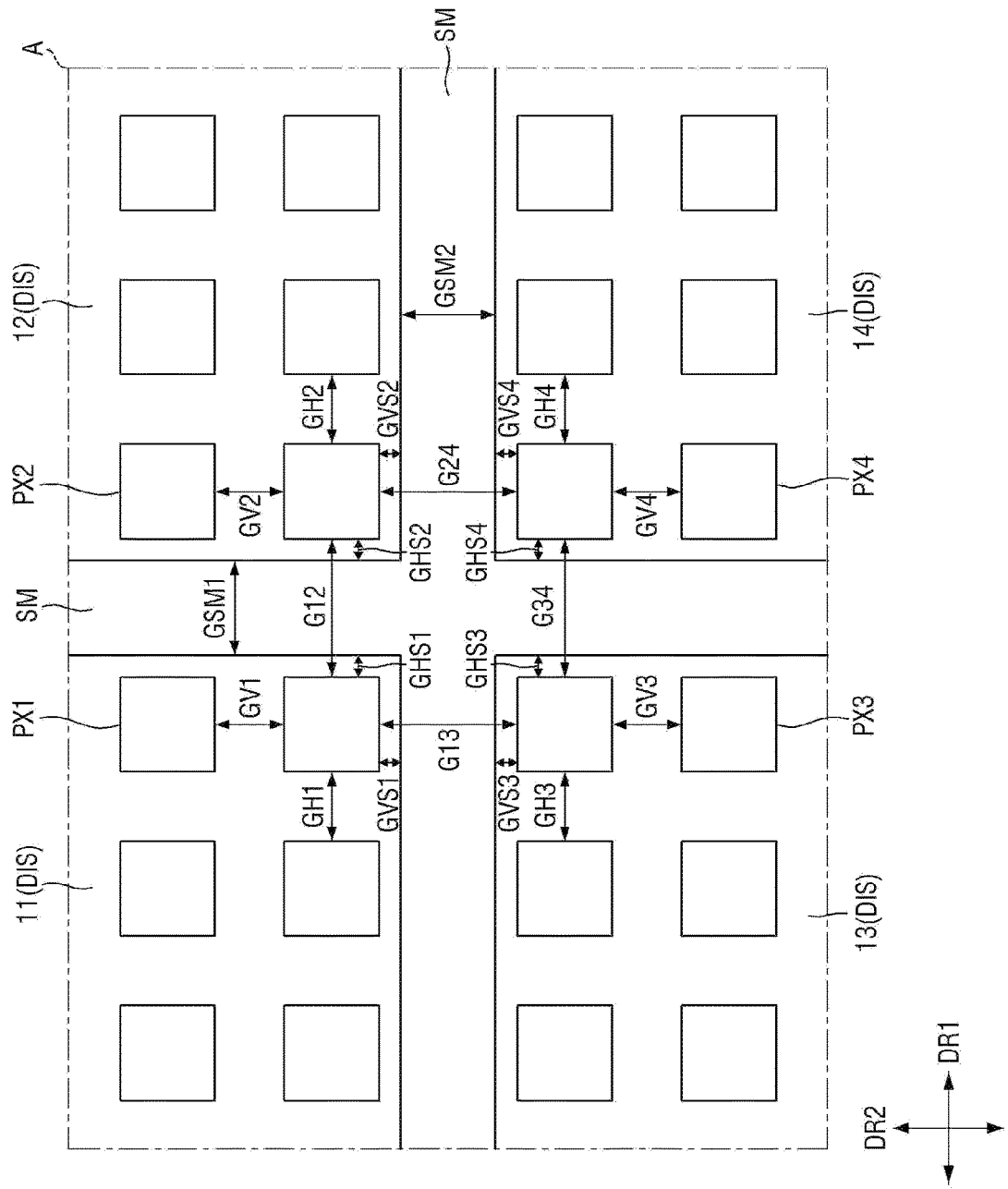
FIG. 4 is a layout view illustrating an area A of FIG. 1, including first pixels of a first display device of FIG. 1, second pixels of a second display device of FIG. 1, third pixels of a third display device of FIG. 1, and fourth pixels of a fourth display device of FIG. 1, according to an embodiment.

FIG. 4 is a layout view illustrating an area A of FIG. 1, including first pixels of the first display device of FIG. 1, second pixels of the second display device of FIG. 1, third pixels of the third display device of FIG. 1, and fourth pixels of the fourth display device of FIG. 1, according to an embodiment.

Referring to FIG. 4, the seams SM may form a shape of a cross or a plus sign in a plan view in part of the tiled display device TD where the first through fourth display devices 11 through 14 adjoin one another. The seams SM may be disposed between the first and second display devices 11 and 12, between the first and third display devices 11 and 13, between the second and fourth display devices 12 and 14, and between the third and fourth display devices 13 and 14.

The display panel DIS of the first display device 11 may include first pixels PX1, which are arranged in a matrix in the first and second directions DR1 and DR2 to display an image. The display panel DIS of the second display device 12 may include second pixels PX2, which are arranged in a matrix in the first and second directions DR1 and DR2 to display an image. The display panel DIS of the third display device 13 may include third pixels PX3, which are arranged in a matrix in the first and second directions DR1 and DR2 to display an image. The display panel DIS of the fourth display device 14 may include fourth pixels PX4, which are arranged in a matrix in the first and second directions DR1 and DR2 to display an image.

Each pair of adjacent first pixels PX1 in the first direction DR1 may be spaced from each other by a first horizontal distance GH1, and each pair of adjacent second pixels PX2 in the first direction DR1 may be spaced from each other by a second horizontal distance GH2. The first and second horizontal distances GH1 and GH2 may be substantially the same.

A seam SM may be disposed between each pair of adjacent first and second pixels PX1 and PX2 in the first direction DR1. A distance G12 between each pair of adjacent first and second pixels PX1 and PX2 in the first direction DR1 may be the sum of a distance GHS1 (in the first direction DR1) between the seam SM and the first pixels PX1, a distance GHS2 (in the first direction DR1) between the seam SM and the second pixels PX2, and a width GSM1 (in the first direction DR1) of the seam SM.

As the distance GHS1 or GHS2 or the width GSM1 increases, the distance G12 may also increase. Thus, to minimize the distance G12, the distance GHS1 may be smaller than the first horizontal distance GH1, and the distance GHS2 may be smaller than the second horizontal distance GH2.

Each pair of adjacent third pixels PX3 in the first direction DR1 may be spaced from each other by a third horizontal distance GH3, and each pair of adjacent fourth pixels PX4 in the first direction DR1 may be spaced from each other by a fourth horizontal distance GH4. The third and fourth horizontal distances GH3 and GH4 may be substantially the same.

A seam SM may be disposed between each pair of adjacent third and fourth pixels PX3 and PX4 in the first direction DR1. A distance G34 between each pair of adjacent third and fourth pixels PX3 and PX4 in the first direction DR1 may be the sum of a distance GHS3 (in the first direction DR1) between the seam SM and the third pixels PX3, a distance GHS4 (in the first direction DR1) between the seam SM and the fourth pixels PX4, and the width GSM1 (in the first direction DR1) of the seam SM.

As the distance GHS3 or GHS4 or the width GSM1 increases, the distance G34 may also increase. Thus, to minimize the distance G34, the distance GHS3 may be smaller than the third horizontal distance GH3, and the distance GHS4 may be smaller than the fourth horizontal distance GH4.

Each pair of adjacent first pixels PX1 in the second direction DR2 may be spaced from each other by a first vertical distance GV1, and each pair of adjacent third pixels PX3 in the second direction DR2 may be spaced from each other by a third vertical distance GV3. The first and third vertical distances GV1 and GV3 may be substantially the same.

A seam SM may be disposed between each pair of adjacent first and third pixels PX1 and PX3 in the second direction DR2. A distance G13 between each pair of adjacent first and third pixels PX1 and PX3 in the second direction DR2 may be the sum of a distance GVS1 (in the second direction DR2) between the seam SM and the first pixels PX, a distance GVS3 (in the second direction DR2) between the seam SM and the third pixels PX3, and a width GSM2 (in the second direction DR2) of the seam SM.

As the distance GVS1 or GVS3 or the width GSM2 increases, the distance G13 may also increase. Thus, to minimize the distance G13, the distance GVS1 may be smaller than the first vertical distance GV1, and the distance GVS3 may be smaller than the third vertical distance GV3.

Each pair of adjacent second pixels PX2 in the second direction DR2 may be spaced from each other by a second vertical distance GV2, and each pair of adjacent fourth pixels PX4 in the second direction DR2 may be spaced from each other by a fourth vertical distance GV4. The second and fourth vertical distances GV2 and GV4 may be substantially the same.

A seam SM may be disposed between each pair of adjacent second and fourth pixels PX2 and PX4 in the second direction DR2. A distance G24 between each pair of adjacent second and fourth pixels PX2 and PX4 in the second direction DR2 may be the sum of a distance GVS2 (in the second direction DR2) between the seam SM and the second pixels PX, a distance GVS4 (in the second direction DR2) between the seam SM and the fourth pixels PX4, and the width GSM2 (in the second direction DR2) of the seam SM.

As the distance GVS2 or GVS4 or the width GSM2 increases, the distance G24 may also increase. Thus, to minimize the distance G24, the distance GVS2 may be smaller than the second vertical distance GV2, and the distance GVS4 may be smaller than the fourth vertical distance GV4.

Because no second non-display area NDA2 is provided, as illustrated in FIGS. 3A, 3B, and 4, the distances between the seams SM and pixels disposed along the sides of the first through fourth display devices 11 through 14 may be smaller than the distances between the pixels PX, such that images displayed by the first through fourth display devices 11 through 14 may appear seamless.

Figure 5:
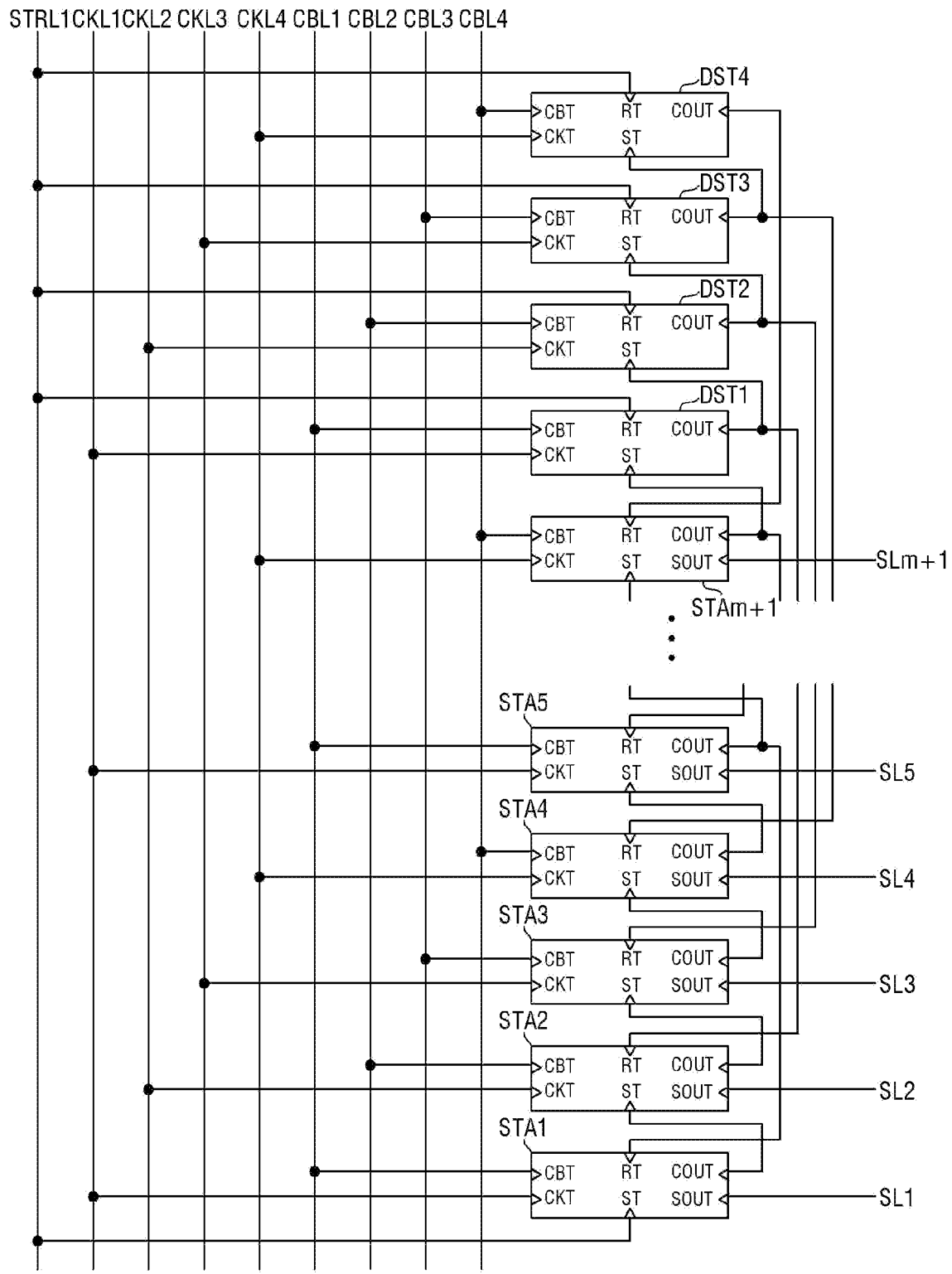
FIG. 5 is a diagram illustrating first through fifth stages, an m-th stage, and first through fourth dummy stages of FIG. 3A according to an embodiment.

FIG. 5 is a circuit diagram illustrating the first through fifth stages, the (m+1)-th stage, and the first through fourth dummy stages of FIG. 3A.

Referring to FIG. 5, each of the first through (m+1)-th stages STA1 through STAm+1 may include a start signal input unit ST, a reset signal input unit RT, a clock signal input unit CKT, a clock bar signal input unit CBT, a scan signal output unit SOUT, and a carry signal output unit COUT. Each of the first through fourth dummy stages DST1 through DST4 may include a start signal input unit ST, a reset signal input unit RT, a clock signal input unit CKT, a clock bar signal input unit CBT, and a carry signal output unit COUT. Each of the first through fourth dummy stages DST1 through DST4 may include no scan signal output unit SOUT.

Referring to FIGS. 3A and 5, start signal input units ST of the first through (m+1)-th stages STA1 through STAm+1 and the first through fourth dummy stages DST1 through DST4 may be connected to the first start line STRL1, the second start line STRL2, or the carry signal output units COUT of immediately previous stages.

The start signal input unit ST of the first stage STA1 of the first scan driving circuit GDC1 may be connected to the first start line STRL1, which transmits the first start signal STR1. The start signal input unit ST of the first stage STA1 of the second scan driving circuit GDC2 may be connected to the second start line STRL2, which transmits the second start signal STR2.

The start signal input units ST of the second through (m+1)-th stages STA2 through STAm+1 and the first through fourth dummy stages DST1 through DST4 may be connected to the carry signal output units COUT of their respective immediately previous stages.

The start signal input unit ST of the second stage STA2 may be connected to the carry signal output unit COUT of the first stage STA1, and the start signal input unit ST of the third stage STA3 may be connected to the carry signal output unit COUT of the second stage STA2.

The reset signal input units RT of the first through (m+1)-th stages STA1 through STAm+1 may be connected to the carry signal output units COUT of their corresponding subsequent stages. The reset signal input unit RT of the first stage STA1 may be connected to the carry signal output unit COUT of the fifth stage STA5, and the reset signal input unit RT of the (m+1)-th stage STAm+1 may be connected to the carry signal output unit COUT of the fourth dummy stage DST4.

The reset signal input units RT of the first through fourth dummy stages DST1 through DST4 of the first scan driving circuit GDC1 may be connected in common to the first start signal line STRL1, which transmits the first start signal STR1. Similarly, the reset signal input units RT of the first through fourth dummy stages DST1 through DST4 of the second scan driving circuit GDC2 may be connected in common to the second start signal line STRL2, which transmits the second start signal STR2.

Each of the clock signal input units CKT of the first through (m+1)-th stages STA1 through STAm+1 and the first through fourth dummy stages DST1 through DST4 may be connected to one of first through fourth clock lines CKL1 through CKL4. Each of the clock bar signal input units CBT of the clock signal input unit CKT of the first through (m+1)-th stages STA1 through STAm+1 and the first through fourth dummy stages DST1 through DST4 may be connected to one of first through fourth clock bar lines CBL1 through CBL4.

The first through (m+1)-th stages STA1 through STAm+1 and the first through fourth dummy stages DST1 through DST4 may be divided into groups of four. In each of the groups, the four stages may be respectively connected to the first through fourth clock lines CKL1 through CKL4 and may be respectively connected to the first through fourth clock bar lines CBL1 through CBL4. The clock signal input unit CKT of the first stage STA1 may be connected to the first clock line CKL1, and the clock bar signal input unit CBT of the first stage STA1 may be connected to the first clock bar line CBL1. The clock signal input unit CKT of the second stage STA2 may be connected to the second clock line CKL2, and the clock bar signal input unit CBT of the second stage STA2 may be connected to the second clock bar line CBL2. The clock signal input unit CKT of the third stage STA3 may be connected to the third clock line CKL3, and the clock bar signal input unit CBT of the third stage STA3 may be connected to the third clock bar line CBL3. The clock signal input unit CKT of the fourth stage STA4 may be connected to the fourth clock line CKL4, and the clock bar signal input unit CBT of the fourth stage STA4 may be connected to the fourth clock bar line CBL4. The clock signal input unit CKT of the fifth stage STA5 may be connected to the first clock line CKL1, and the clock bar signal input unit CBT of the fifth stage STA5 may be connected to the first clock bar line CBL1.

The clock signal input unit CKT of the (m+1)-th stage STAm+1 may be connected to the fourth clock line CKL4, and the clock bar signal input unit CBT of the (m+1)-th stage STAm+1 may be connected to the fourth clock bar line CBL4. The clock signal input unit CKT of the first dummy stage DST1 may be connected to the first clock line CKL1, and the clock bar signal input unit CBT of the first dummy stage DST1 may be connected to the first clock bar line CBL1. The clock signal input unit CKT of the second dummy stage DST2 may be connected to the second clock line CKL2, and the clock bar signal input unit CBT of the second dummy stage DST2 may be connected to the second clock bar line CBL2. The clock signal input unit CKT of the third dummy stage DST3 may be connected to the third clock line CKL3, and the clock bar signal input unit CBT of the third dummy stage DST3 may be connected to the third clock bar line CBL3. The clock signal input unit CKT of the fourth dummy stage DST4 may be connected to the fourth clock line CKL4, and the clock bar signal input unit CBT of the fourth dummy stage DST4 may be connected to the fourth clock bar line CBL4.

The first through (m+1)-th stages STA1 through STAm+1 may be connected to the first through (m+1)-th scan lines SL1 through SLm+1, respectively. The scan signal output units SOUT of the first through (m+1)-th stages STA1 through STAm+1 may be connected to their respective scan lines. The first stage STA1 may be connected to the first scan line SL1, the second stage STA2 may be connected to the second scan line SL2, the third stage STA3 may be connected to the third scan line SL3, the fourth stage STA4 may be connected to the fourth scan line SL4, the fifth stage STA5 may be connected to the fifth scan line SL5, and the (m+1)-th stage STAm+1 may be connected to the (m+1)-th scan line SLm+1.

The carry signal output units COUT of most of the first through (m+1)-th stages STA1 through STAm+1 and the first through fourth dummy stages DST1 through DST4 may be connected to the rest signal input units RT of their respective corresponding previous stages and the start signal input units ST of their respective immediately subsequent stages. The carry signal output units COUT of the first through fourth stages STA1 through STA4 may be connected to the start signal input units ST of their respective immediately subsequent stages. The carry signal output unit COUT of the fourth dummy stage DST4 may be connected to the reset signal input unit RT of the (m+1)-th stage STAm+1 without being connected to any start signal input unit ST.

The first through (m+1)-th stages STA1 through STAm+1 of the first scan driving circuit GDC1 may sequentially output scan signals. The first through fourth dummy stages DST1 through DST4 of the first scan driving circuit GDC1, which are closes to the first circuit is board CB1, may output carry signals for resetting the (m−2)-th, (m−1)-th, m-th, and (m+1)-th stages STAm−2, STAm−1, STAm, and STAm+1.

Figure 6:
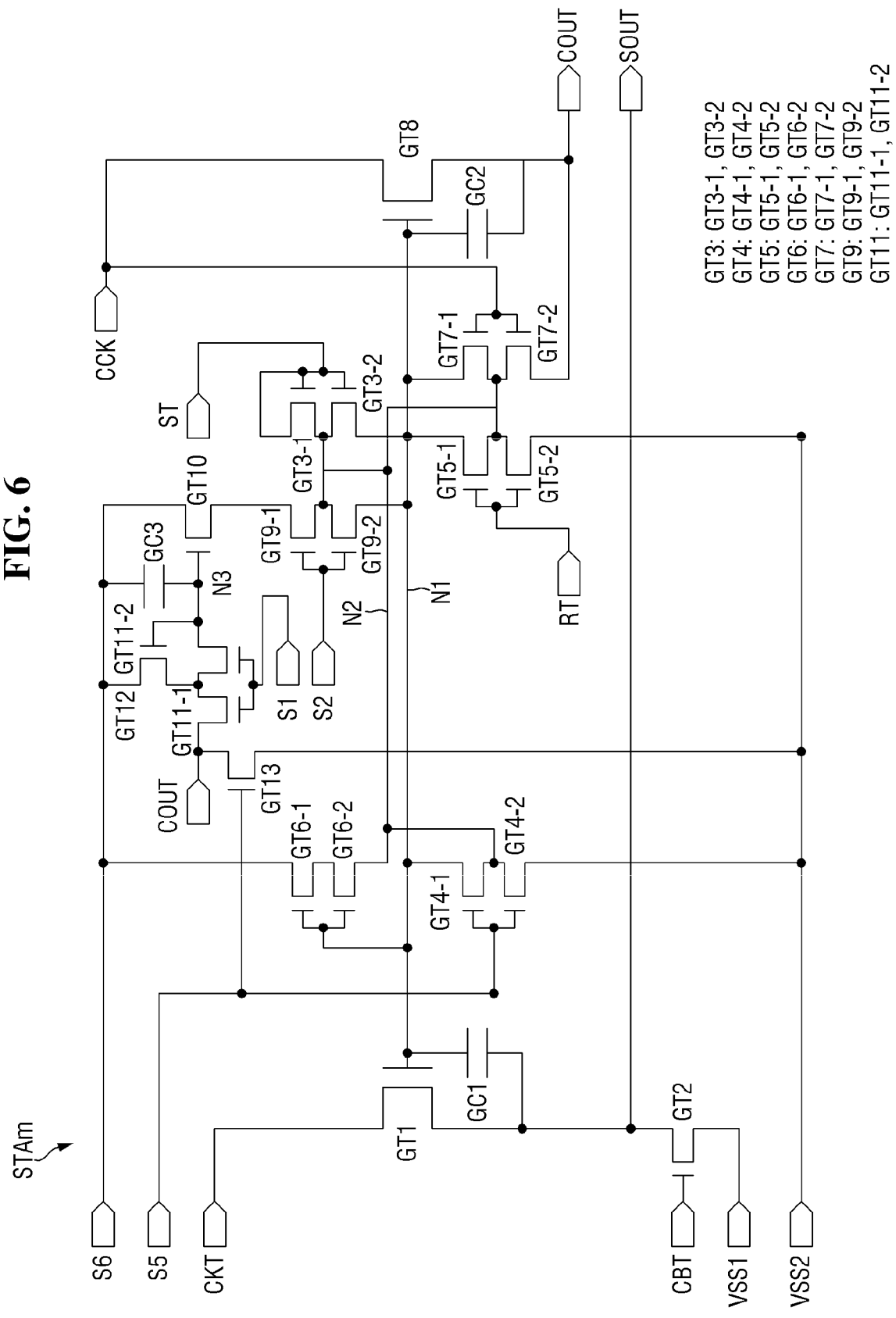
FIG. 6 is a circuit diagram illustrating the m-th stage of FIG. 5 according to an embodiment.

FIG. 6 is a circuit diagram illustrating the m-th stage of FIG. 5 according to an embodiment.

Referring to FIG. 6, the m-th stage STAm may receive scan control signals and may output a scan signal. The scan control signals may include a clock signal (input to the clock signal input unit CKT), a clock bar signal (input to the clock bar input unit CBT), a carry clock signal (input to the carry clock signal input unit CCT), a first input signal (input to a first input unit S1), a second input signal (input to a second input unit S2), a fifth input signal (input to a fifth input unit S5), a sixth input signal (input to a sixth input unit S6), a first power supply voltage (input to a first power supply input unit VSS1), and a second power supply voltage (input to a second power supply input unit VSS2).

The m-th stage STAm may include a plurality of scan transistors and a plurality of scan capacitors. The m-th stage STAm may include first through thirteenth scan transistors GT1 through GT13 and first through third scan capacitors GC1 through GC3.

The first scan transistor GT1 may be turned on by the voltage of a first node N1 to provide the clock signal, which is input to the clock signal input unit CKT, to the scan signal output unit SOUT. The first scan transistor GT1 may be a pull-up transistor of the m-th stage STAm. The gate electrode of the first scan transistor GT1 may be connected to the first node N1, the drain electrode of the first scan transistor GT1 may be connected to the clock signal input unit CKT, and the source electrode of the first scan transistor GT1 may be connected to the scan signal output unit SOUT.

The first scan capacitor GC1 may be connected between the first node N1 and the scan signal output unit SOUT. The first scan capacitor GC1 may be connected between the gate electrode and the source electrode of the first scan transistor GT1. Thus, the first scan capacitor GC1 can maintain the difference in electric potential between the gate electrode and the source electrode of the first scan transistor GT1.

The second scan transistor GT2 may be turned on by the clock bar signal from the clock bar input unit CBT, to discharge the scan signal output unit SOUT to as low as the first power supply voltage, which is input to the first power supply input unit VSS1. The second scan transistor GT2 may be a pull-down transistor of the m-th stage STAm. The gate electrode of the second scan transistor GT2 may be connected to the clock bar signal input unit CBT, the drain electrode of the second scan transistor GT2 may be connected to the scan signal output unit SOUT, and the source electrode of the second scan transistor GT2 may be connected to the first power supply input unit VSS1.

The third scan transistor GT3 may be turned on by the start signal from the start signal input unit ST or a carry signal of a stage previous to the m-th stage STAm to provide the start signal or the carry signal of the previous stage to the first node N1. The third scan transistor GT3 may be a dual transistor including (3-1)-th and (3-2)-th scan transistors GT3-1 and GT3-2. The gate electrode and the drain electrode of the (3-1)-th scan transistor GT3-1 may be connected to the start signal input unit ST, and the source electrode of the (3-1)-th scan transistor GT3-1 may be connected to the drain electrode of the (3-2)-th scan transistor GT3-2. The gate electrode of the (3-2)-th scan transistor GT3-2 may be connected to the start signal input unit ST, the drain electrode of the (3-2)-th scan transistor GT3-2 may be connected to the source electrode of the (3-1)-th scan transistor GT3-1, and the source electrode of the (3-2)-th scan transistor GT3-2 may be connected to the first node N1. As the source electrode of the (3-1)-th scan transistor GT3-1 and the drain electrode of the (3-2)-th scan transistor GT3-2 are connected to a second node N2, the leakage current between the (3-1)-th and (3-2)-th scan transistors GT3-1 and GT3-2 can be minimized.

The fourth scan transistor GT4 may be turned on by the fifth input signal from the fifth input unit S5 to discharge the first node N1. The fourth scan transistor GT4 may be a dual transistor including (4-1)-th and (4-2)-th scan transistors GT4-1 and GT4-2. The gate electrode of the (4-1)-th scan transistor GT4-1 may be connected to the fifth input unit S5, the drain electrode of the (4-1)-th scan transistor GT4-1 may be connected to the first node N1, and the source electrode of the (4-1)-th scan transistor GT4-1 may be connected to the drain electrode of the (4-2)-th scan transistor GT4-2. The gate electrode of the (4-2)-th scan transistor GT4-2 may be connected to the fifth input unit S5, the drain electrode of the (4-2)-th scan transistor GT4-2 may be connected to the source electrode of the (4-1)-th scan transistor GT4-1, and the source electrode of the (4-2)-th scan transistor GT4-2 may be connected to the second power supply input unit VSS2. As the source electrode of the (4-1)-th scan transistor GT4-1 and the drain electrode of the (4-2)-th scan transistor GT4-2 are connected to the second node N2, the leakage current between the (4-1)-th and (4-2)-th scan transistors GT4-1 and GT4-2 can be minimized.

The fifth scan transistor GT5 may be turned on by a carry signal of a stage subsequent to the m-th stage STAm, from the reset signal input unit RT, to discharge the first node N1. The fifth scan transistor GT5 may be a dual transistor including (5-1)-th and (5-2)-th scan transistors GT5-1 and GT5-2. The gate electrode of the (5-1)-th scan transistor GT5-1 may be connected to the reset signal input unit RT, the drain electrode of the (5-1)-th scan transistor GT5-1 may be connected to the first node N1, and the source electrode of the (5-1)-th scan transistor GT5-1 may be connected to the drain electrode of the (5-2)-th scan transistor GT5-2. The gate electrode of the (5-2)-th scan transistor GT5-2 may be connected to the reset signal input unit RT, the drain electrode of the (5-2)-th scan transistor GT5-2 may be connected to the source electrode of the (5-1)-th scan transistor GT5-1, and the source electrode of the (5-2)-th scan transistor GT5-2 may be connected to the second power supply input unit VSS2. As the source electrode of the (5-1)-th scan transistor GT5-1 and the drain electrode of the (5-2)-th scan transistor GT5-2 are connected to the second node N2, the leakage current between the (5-1)-th and (5-2)-th scan transistors GT5-1 and GT5-2 can be minimized.

The sixth scan transistor GT6 may be turned on by the voltage of the first node N1 to provide the sixth input signal from the sixth input unit S6 to the second node N2. The sixth scan transistor GT6 may be a dual transistor including (6-1)-th and (6-2)-th scan transistors GT6-1 and GT6-2. The gate electrode of the (6-1)-th scan transistor GT6-1 may be connected to the first node N1, the drain electrode of the (6-1)-th scan transistor GT6-1 may be connected to the sixth input unit S6, and the source electrode of the (6-1)-th scan transistor GT6-1 may be connected to the drain electrode of the (6-2)-th scan transistor GT6-2. The gate electrode of the (6-2)-th scan transistor GT6-2 may be connected to the first node N1, the drain electrode of the (6-2)-th scan transistor GT6-2 may be connected to the source electrode of the (6-1)-th scan transistor GT6-1, and the source electrode of the (6-2)-th scan transistor GT6-2 may be connected to the second node N2.

The seventh scan transistor GT7 may be turned on by the carry clock signal from the carry clock signal input unit CCK to output the voltage of the first node N1 to the carry signal output unit COUT. The seventh scan transistor GT7 may be a dual transistor including (7-1)-th and (7-2)-th scan transistors GT7-1 and GT7-2. The gate electrode of the (7-1)-th scan transistor GT7-1 may be connected to the carry clock signal input unit CCK, the drain electrode of the (7-1)-th scan transistor GT7-1 may be connected to the first node N1, and the source electrode of the (7-1)-th scan transistor GT7-1 may be connected to the drain electrode of the (7-2)-th scan transistor GT7-2. The gate electrode of the (7-2)-th scan transistor GT7-2 may be connected to the carry clock signal input unit CCK, the drain electrode of the (7-2)-th scan transistor GT7-2 may be connected to the source electrode of the (7-1)-th scan transistor GT7-1, and the source electrode of the (7-2)-th scan transistor GT7-2 may be connected to the carry signal output unit COUT. As the source electrode of the (7-1)-th scan transistor GT7-1 and the drain electrode of the (7-2)-th scan transistor GT7-2 are connected to the second node N2, the leakage current between the (7-1)-th and (7-2)-th scan transistors GT7-1 and GT7-2 can be minimized.

The eighth scan transistor GT8 may be turned on by the voltage of the first node N1 to provide the carry clock signal from the carry clock signal input unit CCK to the carry signal output unit COUT. The gate electrode of the eighth scan transistor GT8 may be connected to the first node N1, the drain electrode of the eighth scan transistor GT8 may be connected to the carry clock signal input unit CCK, and the source electrode of the eighth scan transistor GT8 may be connected to the carry signal output unit COUT.

The second scan capacitor GC2 may be connected between the first node N1 and the carry signal output unit COUT. The second scan capacitor GC2 may be connected between the gate electrode and the source electrode of the eighth scan transistor GT8. Thus, the second scan capacitor GC2 can maintain the difference in electric potential between the gate electrode and the source electrode of the eighth scan transistor GT8.

The ninth scan transistor GT9 may be turned on by the second input signal from the second input unit S2 to connect the source electrode of the tenth scan transistor GT10 to the first node N1. The ninth scan transistor GT9 may be a dual transistor including (9-1)-th and (9-2)-th scan transistors GT9-1 and GT9-2. The gate electrode of the (9-1)-th scan transistor GT9-1 may be connected to the second input unit S2, the drain electrode of the (9-1)-th scan transistor GT9-1 may be connected to the source electrode of the tenth scan transistor GT10, and the source electrode of the (9-1)-th scan transistor GT9-1 may be connected to the drain electrode of the (9-2)-th scan transistor GT9-2. The gate electrode of the (9-2)-th scan transistor GT9-2 may be connected to the second input unit S2, the drain electrode of the (9-2)-th scan transistor GT9-2 may be connected to the source electrode of the (9-1)-th scan transistor GT9-1, and the source electrode of the (9-2)-th scan transistor GT9-2 may be connected to the first node N1. As the source electrode of the (9-1)-th scan transistor GT9-1 and the drain electrode of the (9-2)-th scan transistor GT9-2 are connected to the second node N2, the leakage current between the (9-1)-th and (9-2)-th scan transistors GT9-1 and GT9-2 can be minimized.

The tenth scan transistor GT10 may be turned on by the voltage of a third node N3 to provide the sixth input signal from the sixth input unit S6 to the drain electrode of the (9-1)-th scan transistor GT9-1. The gate electrode of the tenth scan transistor GT10 may be connected to the third node N3, the drain electrode of the tenth scan transistor GT10 may be connected to the sixth input unit S6, and the source electrode of the tenth scan transistor GT10 may be connected to the drain electrode of the (9-1)-th scan transistor GT9-1.

The third scan capacitor GC3 may be connected between the third node N3 and a sixth input part S6. The third scan capacitor GC3 may be connected between the gate electrode and the drain electrode of the tenth scan transistor GT10. Thus, the third scan capacitor GC3 can maintain the difference in electric potential between the gate electrode and the drain electrode of the tenth scan transistor GT10.

The eleventh scan transistor GT11 may be turned on by the first input signal from the first input unit S1 to connect the carry signal output unit COUT to the third node N3. The eleventh scan transistor GT11 may be a dual transistor including (11-1)-th and (11-2)-th scan transistors GT11-1 and GT11-2. The gate electrode of the (11-1)-th scan transistor GT11-1 may be connected to the first input unit S1, the drain electrode of the (11-1)-th scan transistor GT11-1 may be connected to the carry signal output unit COUT, and the source electrode of the (11-1)-th scan transistor GT11-1 may be connected to the drain electrode of the (11-2)-th scan transistor GT11-2. The gate electrode of the (11-2)-th scan transistor GT11-2 may be connected to the first input unit S1, the drain electrode of the (11-2)-th scan transistor GT11-2 may be connected to the source electrode of the (11-1)-th scan transistor GT11-1, and the source electrode of the (11-2)-th scan transistor GT11-2 may be connected to the third node N3. As the source electrode of the (11-1)-th scan transistor GT11-1 and the drain electrode of the (11-2)-th scan transistor GT11-2 are connected to the source electrode of the twelfth scan transistor GT12, the leakage current between the (11-1)-th and (11-2)-th scan transistors GT11-1 and GT11-2 can be minimized.

The twelfth scan transistor GT12 may be turned on by the voltage of the third node N3 to connect the sixth input signal from the sixth input unit S6 to the source electrode of the (11-1)-th scan transistor GT11-1 or the drain electrode of the (11-2)-th scan transistor GT11-2. The gate electrode of the twelfth scan transistor GT12 may be connected to the third node N3, the drain electrode of the twelfth scan transistor GT12 may be connected to the sixth input unit S6, and the source electrode of the twelfth scan transistor GT12 may be connected to the source electrode of the (11-1)-th scan transistor GT11-1 and the drain electrode of the (11-2)-th scan transistor GT11-2. Thus, the twelfth scan transistor GT12 can maintain the difference in electric potential between the (11-1)-th and (11-2)-th scan transistors GT11-1 and GT11-2.

The thirteenth scan transistor GT13 may be turned on by the fifth input signal from the fifth input unit S5 to connect the carry signal output unit COUT to the second voltage input unit VSS2. The gate electrode of the thirteenth scan transistor GT13 may be connected to the fifth input unit S5, the drain electrode of the thirteenth scan transistor GT13 may be connected to the carry signal output unit COUT, and the source electrode of the thirteenth scan transistor GT13 may be connected to the second power supply input unit VSS2.

The m-th stage STAm may be disposed in the first display area DA1 and may receive, as the scan control signals, the clock signal, the clock bar signal, the carry clock signal, the first input signal, the second input signal, the fifth input signal, the sixth input signal, the first power supply voltage, and the second power supply voltage. As the m-th stage STAm includes the first through thirteenth scan transistors GT1 through GT13 and the first through third scan capacitors GC1 through GC3, the m-th stage STAm can output a scan signal and a carry signal.

The first through (m−1)-th stages STA1 through STAm−1 and the (m+1)-th stage STAm+1 may be analogous the m-th stage STAm of FIG. 6.

The first through fourth dummy stages DST1 through DST4 may be analogous to the m-th stage STAm of FIG. 6 except for the absence of the scan signal output unit SOUT.

Figure 7:
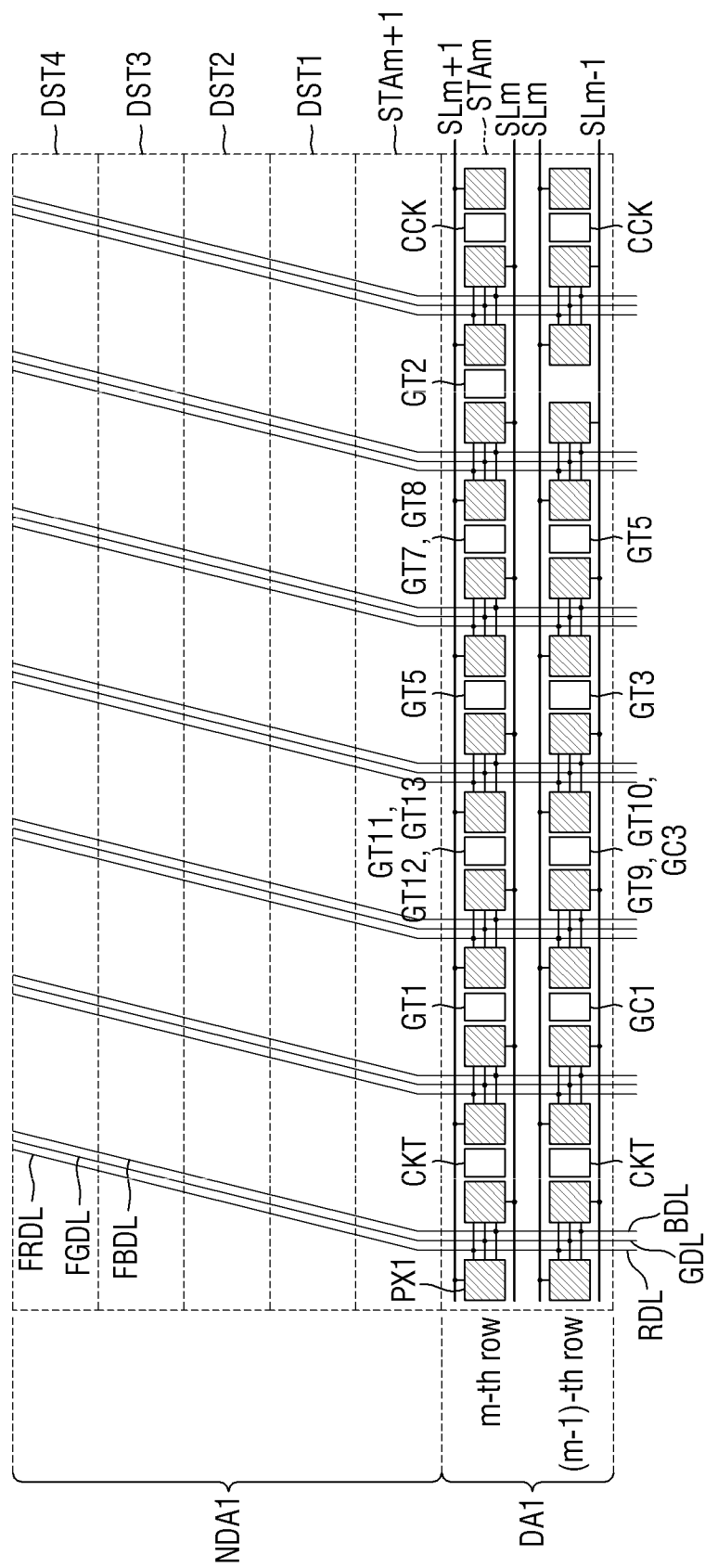
FIG. 7 is a layout view illustrating the m-th stage, an (m+1)-th stage, first through fourth dummy stages, and pixels according to an embodiment.

FIG. 7 is a layout view illustrating the (m−1)-th stage, the m-th stage, the (m+1)-th stage, the first through fourth dummy stages, and pixels according to an embodiment.

FIG. 7 illustrates elements of the (m−1)-th stage STAm−1 and the m-th stage STAm being arranged in the (m−1)-th row and the m-th rows. In FIG. 3B, each of the stages is disposed in one pixel row, however the embodiments are not limited thereto. As shown in FIG. 7, the mth stage STAm is disposed in two pixel rows, for example the first pixel row and the second pixel row.

Referring to FIG. 7, the elements of the m-th stage STAm may be disposed near first pixels PX1. Elements of the m-th stage STAm may be disposed in spaces between first pixels PX1 in the first direction DR1. Elements of the m-th stage STAm may be disposed in spaces between pixels in the second direction DR2 or in spaces between the upper side of the first display area DA1 and the first pixels PX1. The elements of the m-th stage STAm may include at least some of the first through thirteenth scan transistors GT1 through GT13 and the first through third scan capacitors GC1 through GC3 of FIG. 6.

For the m-th stage STAm, the clock signal input unit CKT, the first scan transistor GT1, the eleventh scan transistor GT11, the twelfth scan transistor GT12, the thirteenth scan transistor GT13, the fifth scan transistor GT5, the seventh scan transistor GT7, the eighth scan transistor GT8, the second scan transistor GT2, and the carry clock signal input unit CCK may be sequentially arranged in a left-to-right direction in the remaining spaces between the first pixels PX1 in the m-th row.

For the m-th stage STAm, the clock signal input unit CKT, the first scan capacitor GC1, the ninth scan transistor GT9, the tenth scan transistor GT10, the third scan capacitor GC3, the third scan transistor GT3, the sixth scan transistor GT6, an empty space, and the carry clock signal input unit CCK may be sequentially arranged in the left-to-right direction in remaining spaces between the first pixels PX1 in the (m−1)-th row.

The first through (m−2)-th stages STA1 through STAm−2 may have structures analogous to structures of the (m−1)-th stage STAm−1 and/or the m-th stage STAm of FIG. 7.

The (m+1)-th stage STAm+1 and the first through fourth dummy stages DST1 through DST4 may be disposed in the first non-display area NDA1. Thus, the (m+1)-th stage STAm+1 and the first through fourth dummy stages DST1 through DST4 may overlap with red data fan-out lines FRDL, green data fan-out lines FGDL, and blue data fan-out lines FBDL. The (m+1)-th stage STAm+1 and the first through fourth dummy stages DST1 through DST4 may not overlap with red data lines RDL, green data lines GDL, and blue data lines BDL (which are in the first display area DA1).

Figure 8:
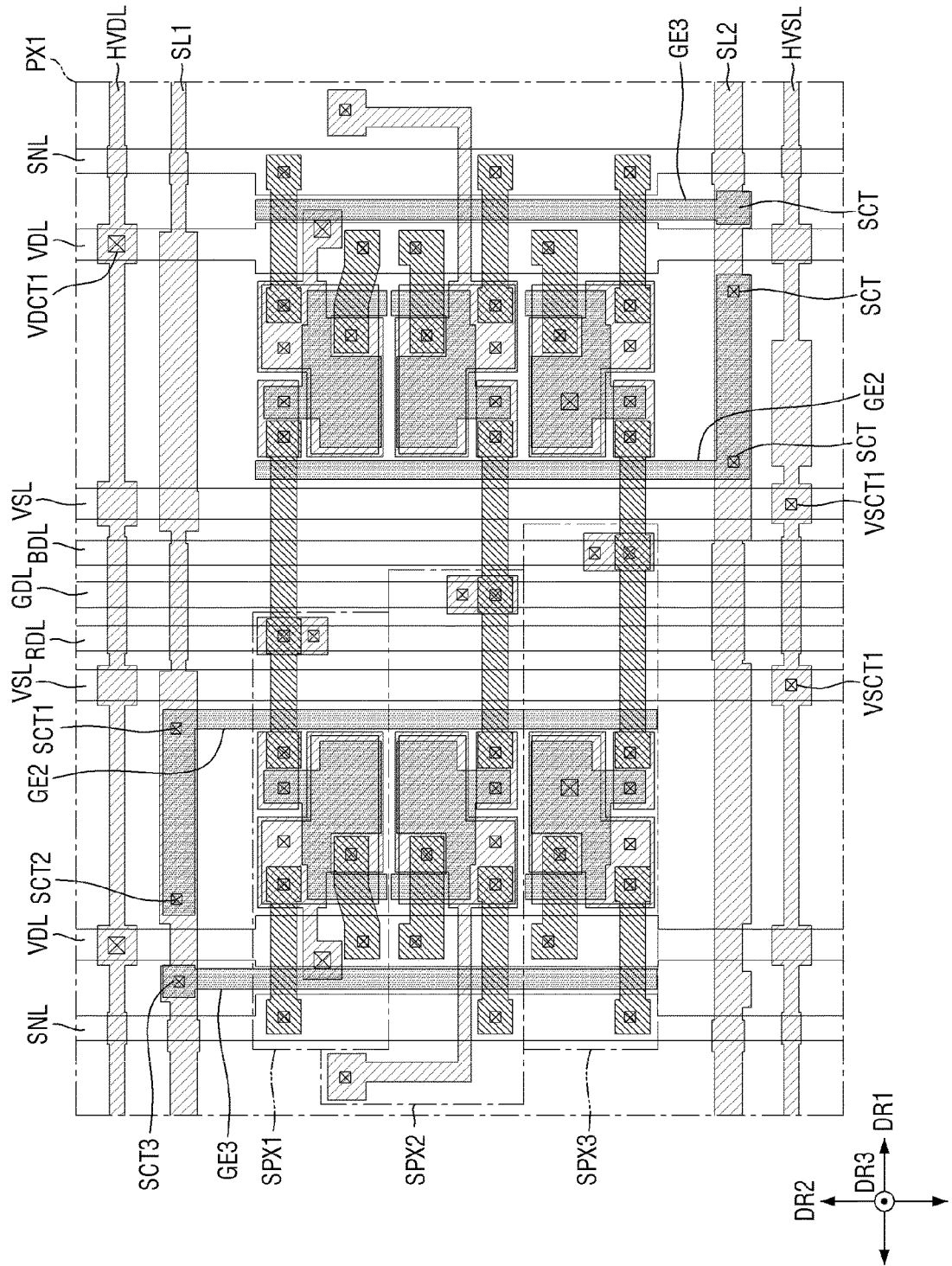
FIG. 8 is a layout view illustrating two adjacent pixels of FIG. 7 according to an embodiment.
Figure 9:
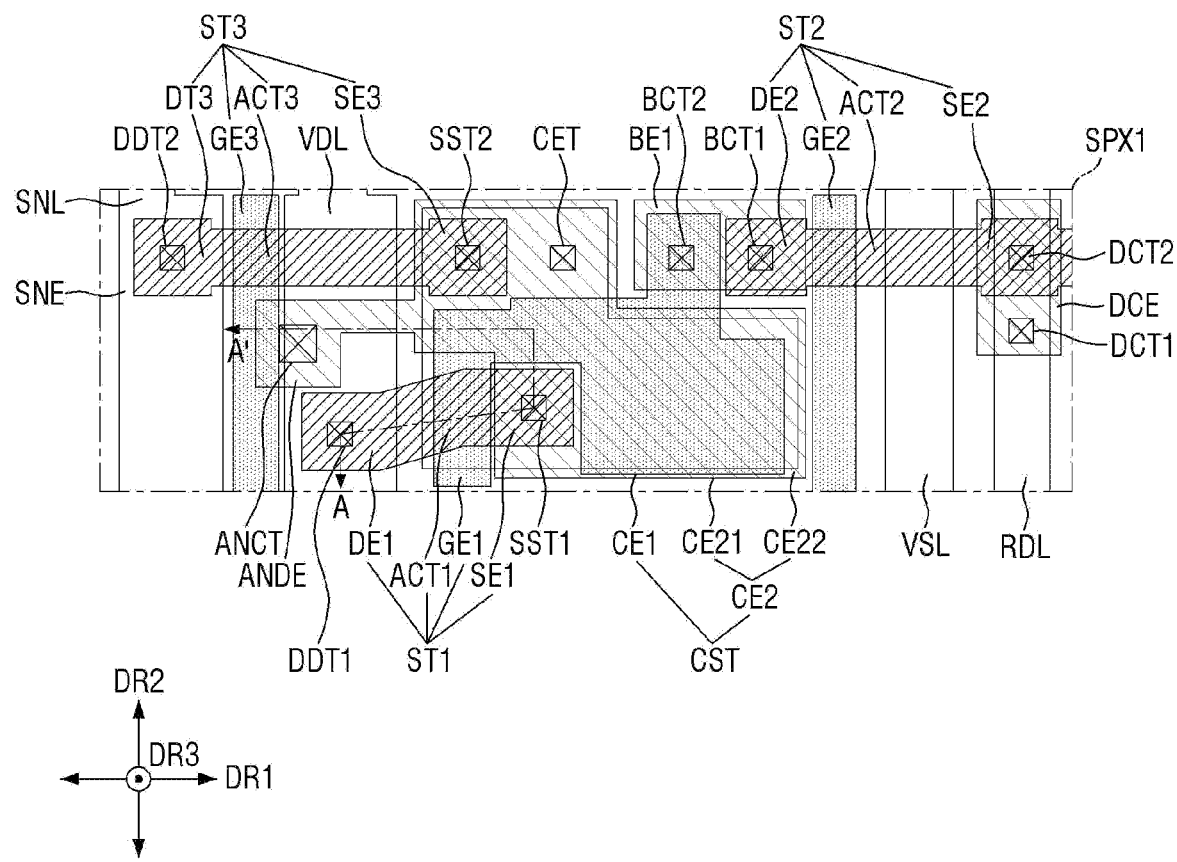
FIG. 9 is a layout view illustrating a first subpixel of FIG. 8 according to an embodiment.
Figure 10:
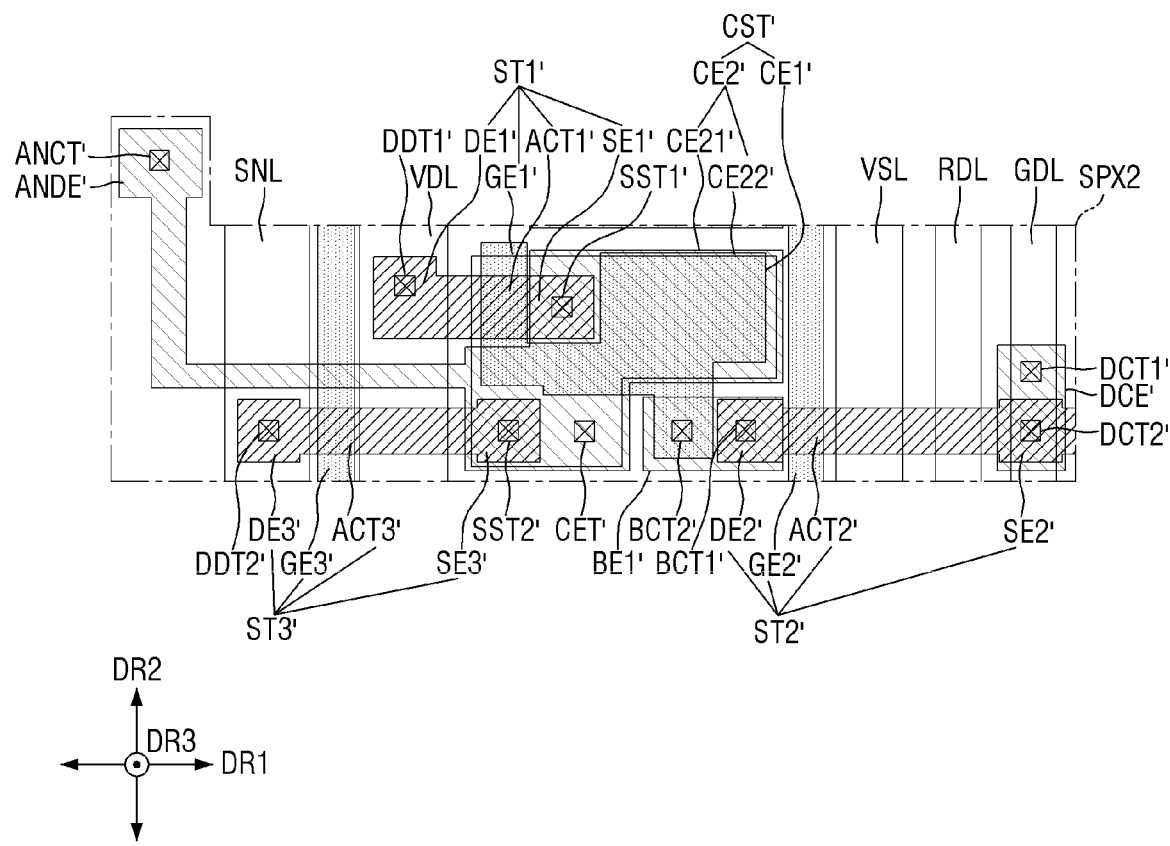
FIG. 10 is a layout view illustrating a second subpixel of FIG. 8 according to an embodiment.
Figure 11:
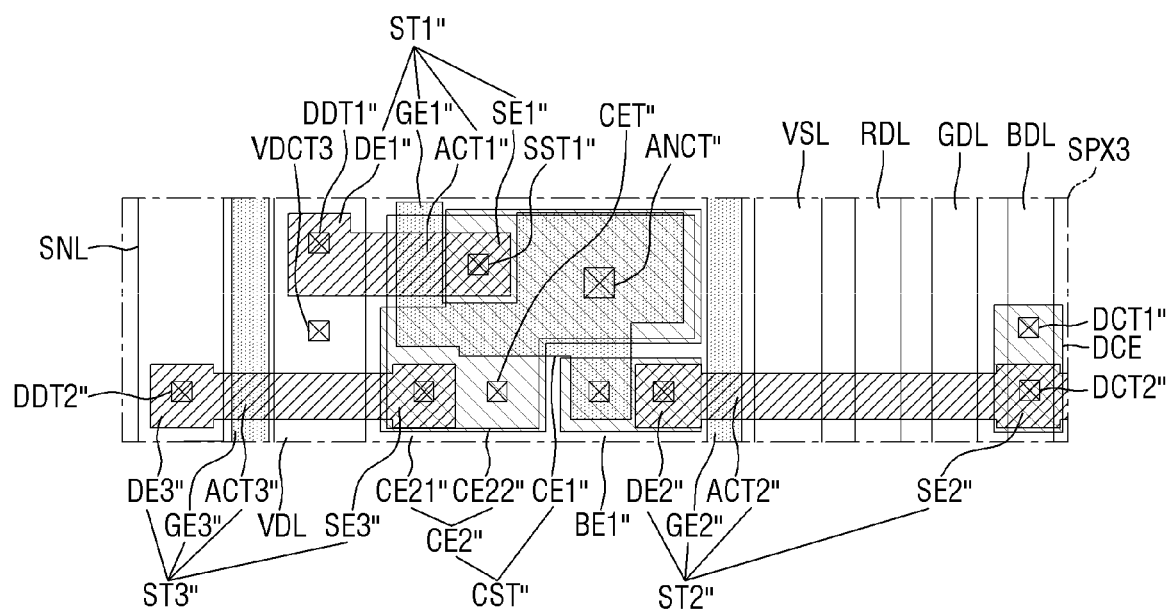
FIG. 11 is a layout view illustrating a third subpixel of FIG. 8 according to an embodiment.
Figure 11:
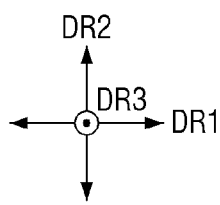

FIG. 8 is a layout view illustrating two adjacent pixels of FIG. 7 according to an embodiment. FIG. 9 is a layout view illustrating a first subpixel of FIG. 8 according to an embodiment. FIG. 10 is a layout view illustrating a second subpixel of FIG. 8 according to an embodiment. FIG. 11 is a layout view illustrating a third subpixel of FIG. 8 according to an embodiment.

Referring to FIGS. 8 through 11, the first scan line SL1, the second scan line SL2, a first horizontal power supply line HVSL, and a second horizontal power supply line HVDL may extend in the first direction DR1. The first scan line SL1, the second scan line SL2, the first horizontal power supply line HVSL, and the second horizontal power supply line HVDL may be substantially parallel to one another. The first scan line SL1, the second scan line SL2, the first horizontal power supply line HVSL, and the second horizontal power supply line HVDL may be spaced from one another in the second direction DR2.

Red, green, and blue data lines RDL, GDL, and BDL, first power supply lines VSL, second power supply lines VDL, and sensing lines SNL may extend in the second direction DR2 and may be substantially parallel to one another. The red, green, and blue data lines RDL, GDL, and BDL, the first power supply lines VSL, the second power supply lines VDL, and the sensing lines SNL may be spaced from one another in the first direction DR1.

Each of the first power supply lines VSL may be connected to the first horizontal power supply line HVSL through at least one first power supply contact hole VSCT1. Thus, the first horizontal power supply line HVSL may have substantially the same electric potential as the first power supply lines VSL. The first horizontal power supply line HVSL may receive the first power supply voltage.

Each of the second power supply lines VDL may be connected to a second horizontal power supply line HVDL through at least one second power supply contact hole VDCT1. Thus, the second horizontal power supply line HVDL may have substantially the same electric potential as the second power supply lines VDL. The second horizontal power supply line HVDL may receive the second power supply voltage.

Each of the first and second scan lines SL1 and SL2 may be connected to a second gate electrode GE2 through first and second scan contact holes SCT1 and SCT2. The first and second scan contact holes SCT1 and SCT2 may be spaced from each other. One of the first and second scan contact holes SCT1 and SCT2 may be optional. The second gate electrode GE2 may include a first extension that extends in the first direction DR1 and a second extension that extends in the second direction DR2. The first extension of the second gate electrode GE2 may overlap the first or second scan line SL1 or SL2 in a third direction DR3. The second extension of the second gate electrode GE2 may be disposed adjacent to the corresponding first power supply line VSL.

Each of the first and second scan lines SL1 and SL2 may be connected to a third gate electrode GE3 through a third scan contact hole SCT3. The third gate electrode GE3 may extend in the second direction DR2.

The red, green, and blue data lines RDL, GDL, and BDL may be interposed between two adjacent first pixels PX1. One of the two first pixels PX1 may be connected to the first scan line SL1, and the other may be connected to the second scan line SL2. The left first pixel PX1, which is to the left of the red, green, and blue data lines RDL, GDL, and BDL, may be connected to the first scan line SL1; the right first pixel PX1, which is to the right of the red, green, and blue data lines RDL, GDL, and BDL, may be connected to the second scan line SL2.

Each of the first pixels PX1 may include first, second, and third subpixels SPX1, SPX2, and SPX3. The first subpixel SPX1 may output red light in accordance with a data voltage from the red data line RDL. The second subpixel SPX2 may output green light in accordance with a data voltage from the green data line GDL. The third subpixel SPX3 may output red light in accordance with a data voltage from the blue data line BDL.

The first, second, and third subpixels SPX1, SPX2, and SPX3 may be arranged in the second direction DR2. The first, second, and third subpixels SPX1, SPX2, and SPX3 may overlap at least one of the red, green, and blue data lines RDL, GDL, and BDL, one of the first power supply lines VSL, one of the second power supply lines VDL, and one of the sensing lines SNL.

Elements of the first, second, and third subpixels SPX1, SPX2, and SPX3 may not overlap the first power supply lines VSL in the third direction DR3. Elements of the first, second, and third subpixels SPX1, SPX2, and SPX3 may not overlap the first scan line SL1, the second scan line SL2, the first horizontal power supply line HVSL, and the second horizontal power supply line HVDL in the third direction DR3. The first, second, and third subpixels SPX1, SPX2, and SPX3 may be disposed between the first and second scan lines SL1 and SL2.

Two adjacent first subpixels SPX1 at opposite sides of a set of red, green, and blue data lines RDL, GDL, and BDL may be connected to the same red data line RDL. Two corresponding adjacent second subpixels SPX2 may be connected to the same green data line GDL. Two corresponding adjacent third subpixels SPX3 may be connected to the same blue data line BDL.

Two adjacent first subpixels SPX1 at opposite sides of a set of red, green, and blue data lines RDL, GDL, and BDL may be connected to different data lines. The first subpixel SPX1 of the left first pixel PX1 may be connected to the blue data line BDL, and the first subpixel SPX1 of the right first pixel PX1 may be connected to the red data line RDL.

Two corresponding adjacent second subpixels SPX2 may be connected to different data lines. The second subpixel SPX2 of the left first pixel PX1 may be connected to the red data line RDL, and the second subpixel SPX2 of the right first pixel PX1 may be connected to the blue data line BDL.

Two corresponding adjacent third subpixels SPX3 may be connected to different data lines.

Figure 14:
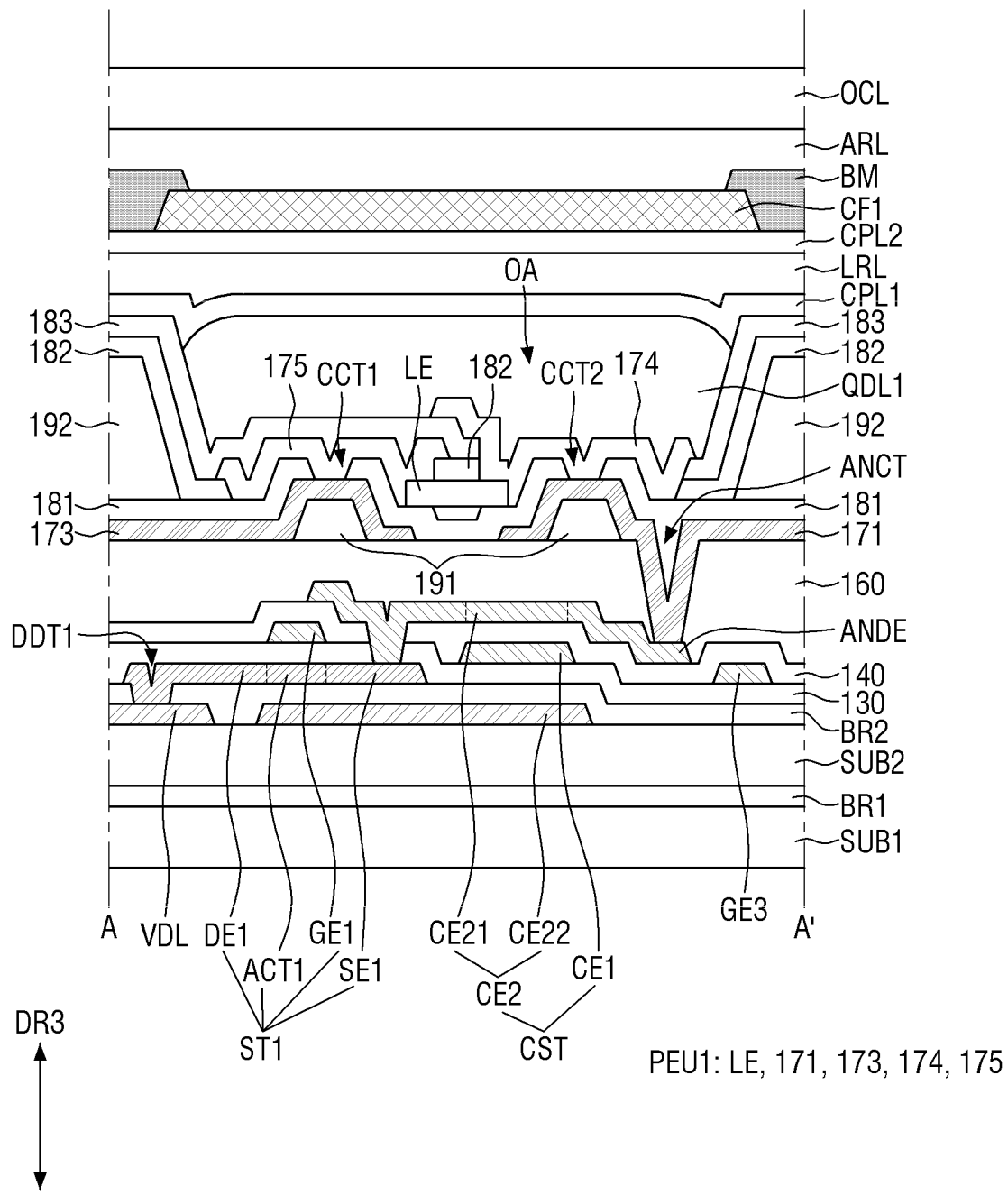
FIG. 14 is a cross-sectional view taken along line A-A' of FIG. 9 according to an embodiment.

Referring to FIG. 9 and FIG. 14, a first subpixel SPX1 may include a first transistor ST1, a second transistor ST2, a third transistor ST3, and a capacitor CST.

The first transistor ST1 may include a first gate electrode GE1, a first active layer ACT1, a first source electrode SE1, and a first drain electrode DE1. The first gate electrode GE1 may be formed in one body (of the same material) with a first electrode CE1 of the capacitor CST. The first active layer ACT1 may overlap the first gate electrode GE1 in the third direction DR3. The first source electrode SE1 may be disposed on one side of the first active layer ACT1, for example, on the right side of the first active layer ACT1. The first source electrode SE1 may be connected to a first anode connecting electrode ANDE and a first sub-electrode CE21 of a second electrode CE2 of the capacitor CST through a first source contact hole SST1. The first drain electrode DE1 may be disposed on the other side of the first active layer ACT1, for example, on the left side of the first active layer ACT1. The first drain electrode DE1 may be connected to a second power supply line VDL through a first drain contact hole DDT1. The anode connecting electrode ANDE may be connected to a pixel electrode 171, which is electrically connected to a light-emitting element LE through an anode contact hole ANCT.

The second transistor ST2 may include a second gate electrode GE2, a second active layer ACT2, a second source electrode SE2, and a second drain electrode DE2. The second active layer ACT2 may overlap the second gate electrode GE2. The second source electrode SE2 may be disposed on one side of the second active layer ACT2, for example, on the right side of the second active layer ACT2. The second source electrode SE2 may be connected to a data connecting electrode DCE through a second data contact hole DCT2. The data connecting electrode DCE may be connected to one of the red, green, and blue data lines RDL, GDL, and BDL through a first data contact hole DCT1. The second drain electrode DE2 may be disposed on the other side of the second active layer ACT2, for example, on the left side of the second active layer ACT2. The second drain electrode DE2 may be connected to a connecting electrode BE1 through a first power supply connecting hole BCT1. The connecting electrode BE1 may be connected to the first gate electrode GE1 and the first electrode CE1 of the capacitor CST through the second power supply connecting hole BCT2.

The third transistor ST3 may include a third gate electrode GE3, a third active layer ACT3, a third source electrode SE3, and a third drain electrode DE3. The third active layer ACT3 may overlap the third gate electrode GE3 in the third direction DR3. The third source electrode SE3 may be disposed on one side of the third active layer ACT3, for example, on the right side of the third active layer ACT3. The third source electrode SE3 may be connected to the first anode connecting electrode ANDE and the second electrode CE2 of the capacitor CST through a second source contact hole SST2. The third drain electrode DE3 may be disposed on the other side of the third active layer ACT3, for example, on the left side of the third active layer ACT3. The third drain electrode DE3 may be connected to a sensing connecting electrode SNE through a second drain contact hole DDT2.

The capacitor CST may include the first and second electrodes CE1 and CE2. The first electrode CE1 may be formed in one body with the first gate electrode GE1. The second electrode CE2 may include the first sub-electrode CE21 and a second sub-electrode CE22. The first sub-electrode CE21 may be formed in one body with the anode connecting electrode ANDE. The second sub-electrode CE22 may be connected to the first sub-electrode CE21 through a capacitor contact hole CET. The first electrode CE1, the first sub-electrode CE21, and the second sub-electrode CE22 of the capacitor CST may overlap one another in the third direction DR3. The first electrode CE1 of the capacitor CST may be disposed between the first and second sub-electrodes CE21 and 22 in the third direction DR3. As the first electrode CE1 and the first sub-electrode CE21 overlap each other and the first electrode CE1 and the second sub-electrode CE22 overlap each other, the capacitor CST may be formed.

Referring to FIG. 10, a second subpixel SPX2 may include a first transistor ST1', a second transistor ST2', a third transistor ST3', and a capacitor CST'.

The first transistor ST1' may include a first gate electrode GE1', a first active layer ACT1', a first source electrode SE1', and a first drain electrode DE1'. The first gate electrode GE1', the first active layer ACT1', the first source electrode SE1', and the first drain electrode DE1' of the first transistor ST1' are analogous to the first gate electrode GE1, the first active layer ACT1, the first source electrode SE1, and the first drain electrode DE1, respectively, of the first transistor ST1 of FIG. 9.

The second transistor ST2' may include a second gate electrode GE2', a second active layer ACT2', a second source electrode SE2', and a second drain electrode DE2'. The second gate electrode GE2', the second active layer ACT2', the second source electrode SE2', and the second drain electrode DE2' of the second transistor ST2' are analogous to the second gate electrode GE2, the second active layer ACT2, the second source electrode SE2, and the second drain electrode DE2, respectively, of the second transistor ST2 of FIG. 9.

The third transistor ST3' may include a third gate electrode GE3', a third active layer ACT3', a third source electrode SE3', and a third drain electrode DE3'. The third gate electrode GE3', the third active layer ACT3', the third source electrode SE3', and the third drain electrode DE3' of the third transistor ST3' are analogous to the third gate electrode GE3, the third active layer ACT3, the third source electrode SE3, and the third drain electrode DE3, respectively, of the third transistor ST3 of FIG. 9.

The capacitor CST' may include a first electrode CE1' and a second electrode CE2', and the second electrode CE2' may include first and second sub-electrodes CE21' and CE22'. The first electrode CE1' and the first and second sub-electrodes CE21' and CE22' of the second electrode CE2' may be the same as the first electrode CE1 and the first and second sub-electrodes CE21 and CE22, respectively, of the second electrode CE2 of FIG. 9.

A connecting electrode BE1', a data connecting electrode DCE', an anode connecting electrode ANDE', and contact holes (DCT1', DCT2', BCT1', BCT2', SST1', SST2', DDT1', DDT2', ANCT', and CET') of the second subpixel SPX2 are analogous to the connecting electrode BE1, the data connecting electrode DCE, the anode connecting electrode ANDE, and the contact holes (DCT1, DCT2, BCT1, BCT2, SST1, SST2, DDT1, DDT2, ANCT, and CET), respectively, of the first subpixel SPX1 of FIG. 9.

Referring to FIG. 11, a third subpixel SPX3 may include a first transistor ST1", a second transistor ST2", a third transistor ST3", and a capacitor CST".

The first transistor ST1" may include a first gate electrode GE1", a first active layer ACT1", a first source electrode SE1", and a first drain electrode DE1". The first gate electrode GE1", the first active layer ACT1", the first source electrode SE1", and the first drain electrode DE1" of the first transistor ST1" are analogous to the first gate electrode GE1, the first active layer ACT1, the first source electrode SE1, and the first drain electrode DE1, respectively, of the first transistor ST1 of FIG. 9.

The second transistor ST2" may include a second gate electrode GE2", a second active layer ACT2", a second source electrode SE2", and a second drain electrode DE2". The second gate electrode GE2", the second active layer ACT2", the second source electrode SE2", and the second drain electrode DE2" of the second transistor ST2" are analogous to the second gate electrode GE2, the second active layer ACT2, the second source electrode SE2, and the second drain electrode DE2, respectively, of the second transistor ST2 of FIG. 9.

The third transistor ST3" may include a third gate electrode GE3", a third active layer ACT3", a third source electrode SE3", and a third drain electrode DE3". The third gate electrode GE3", the third active layer ACT3", the third source electrode SE3", and the third drain electrode DE3" of the third transistor ST3" are analogous to the third gate electrode GE3, the third active layer ACT3, the third source electrode SE3, and the third drain electrode DE3, respectively, of the third transistor ST3 of FIG. 9.

The capacitor CST" may include a first electrode CE1" and a second electrode CE2", and the second electrode CE2" may include first and second sub-electrodes CE21" and CE22". The first electrode CE1" and the first and second sub-electrodes CE21" and CE22" of the second electrode CE2" may be the same as the first electrode CE1 and the first and second sub-electrodes CE21 and CE22, respectively, of the second electrode CE2 of FIG. 9.

A connecting electrode BE1", a data connecting electrode DCE", an anode connecting electrode ANDE", and contact holes (DCT1", DCT2", BCT1", BCT2", SST1", SST2", DDT1", DDT2", ANCT", and CET") of the third subpixel SPX3 are analogous to the connecting electrode BE1, the data connecting electrode DCE, the anode connecting electrode ANDE, and the contact holes (DCT1, DCT2, BCT1, BCT2, SST1, SST2, DDT1, DDT2, ANCT, and CET), respectively, of the first subpixel SPX1 of FIG. 9.

Figure 12:
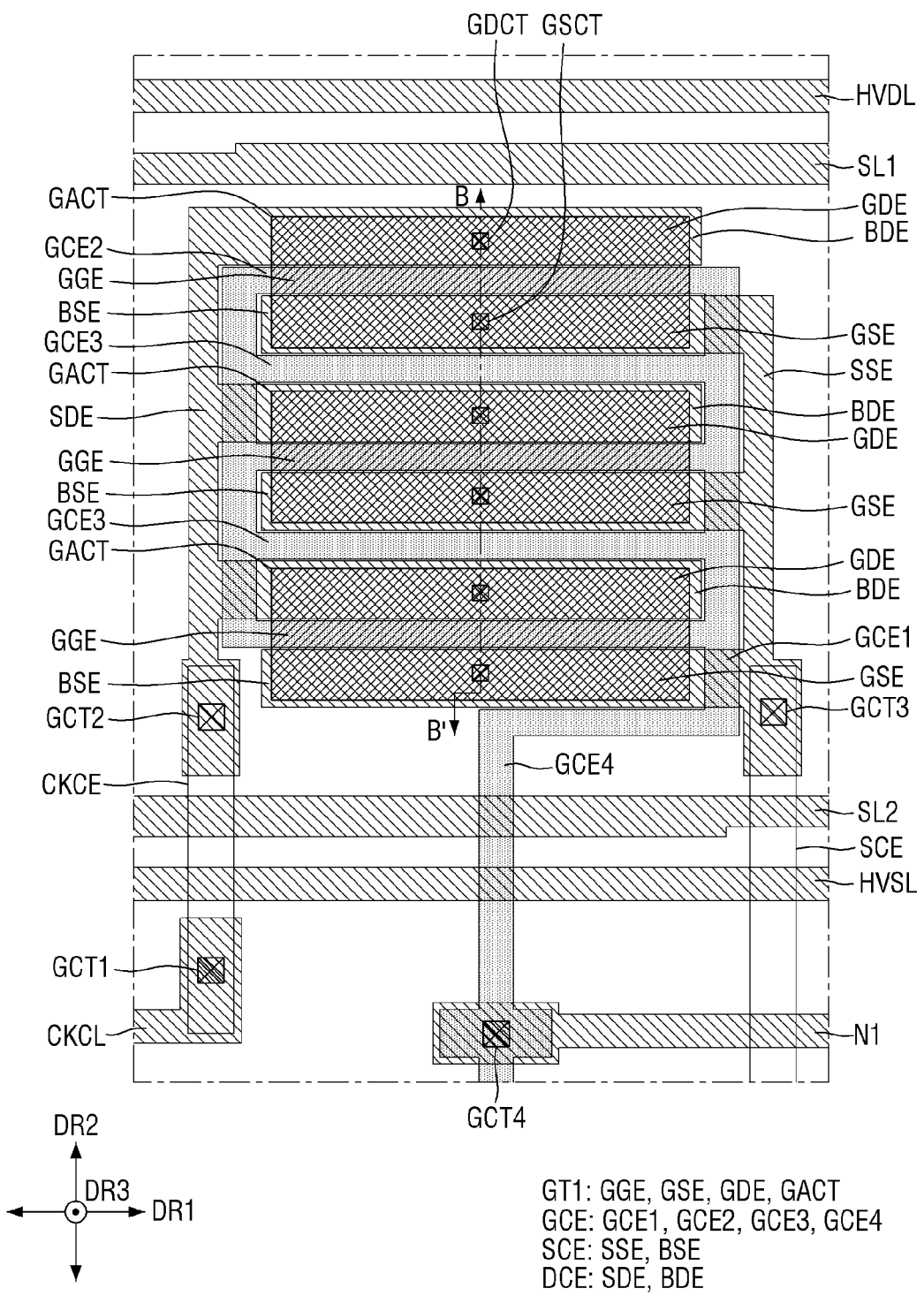
FIG. 12 is a layout view illustrating a first scan transistor of an m-th stage according to an embodiment.
Figure 13:
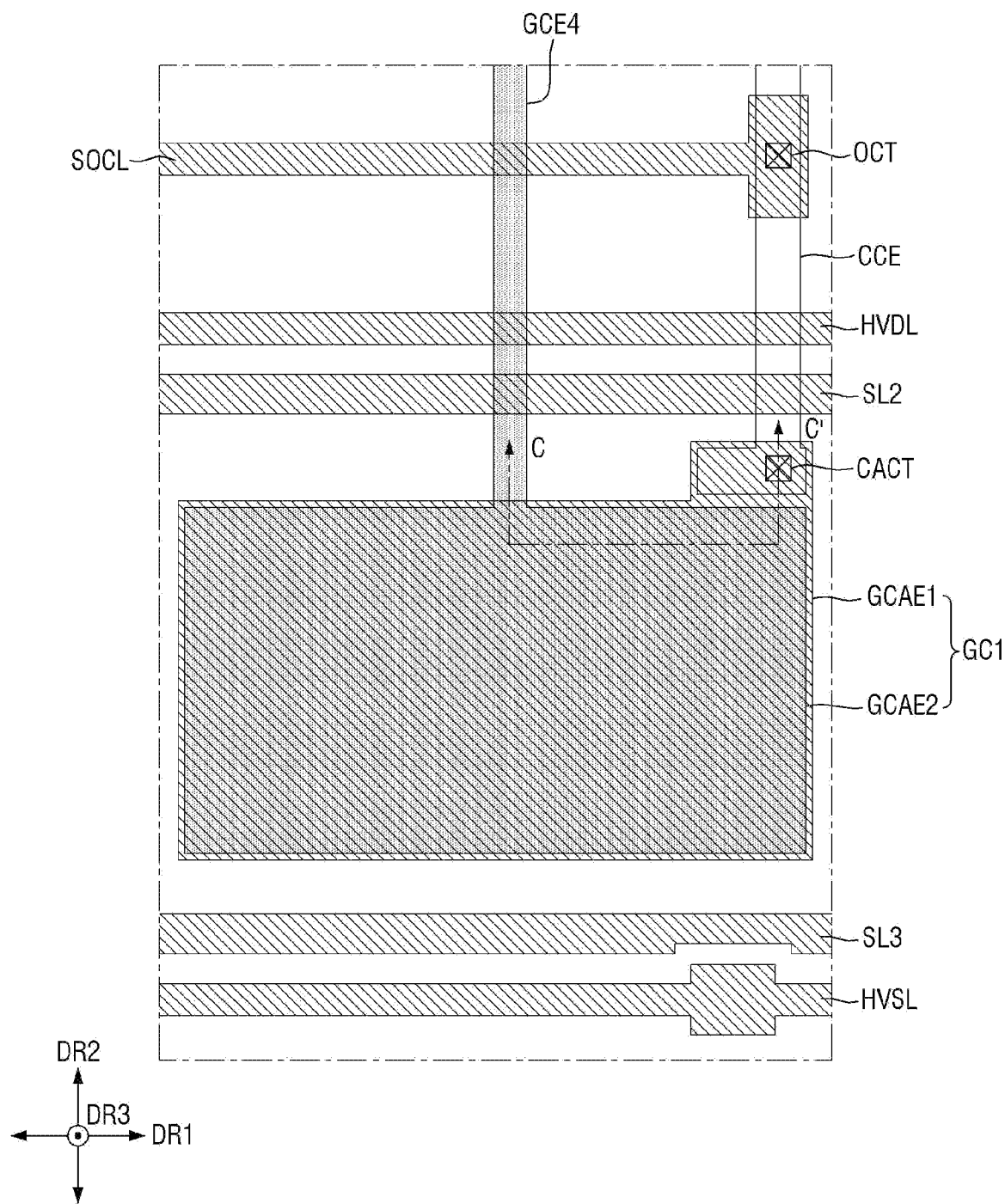
FIG. 13 is a layout view illustrating a first scan capacitor of an m-th stage according to an embodiment.

FIG. 12 is a layout view of the first scan transistor of an m-th stage according to an embodiment. FIG. 13 is a layout view of the first scan capacitor of the m-th stage according to an embodiment.

Referring to FIGS. 12 and 13, the first scan transistor GT1 may be disposed between the first and second scan lines SL1 and SL2 in the second direction DR2. The first scan transistor GT1 may include scan gate electrodes GGE, scan source electrodes GSE, scan drain electrodes GDE, and scan active layers GACT.

The first scan capacitor GC1 may be disposed between the second and third scan lines SL2 and SL3 in the second direction DR2. The first scan capacitor GC1 may include first and second scan capacitor electrodes GCAE1 and GCAE2.

The scan gate electrodes CGE may extend in the first direction DR1. The scan gate electrodes CGE may be connected to the gate connecting electrodes GCE. The gate connecting electrodes GCE may include a first gate connecting electrode GCE1, a second gate connecting electrode GCE2, third gate connecting electrodes GCE3, and a fourth gate connecting electrode GCE4. The first and second gate connecting electrodes GCE1 and GCE2 may extend in the second direction DR1, and the third gate connecting electrodes GCE3 may extend in the first direction DR1. First ends of the scan gate electrodes CGE may be connected to the first gate connecting electrode GCE1, and second ends of the scan gate electrodes CGE may be connected to the second gate connecting electrode GCE2. First ends of the third gate connecting electrodes GCE3 may be connected to the first gate connecting electrode GCE1, and second ends of the third gate connecting electrodes GCE3 may be connected to the second gate connecting electrode GCE2. The fourth gate connecting electrode GCE4 may be connected to the first gate connecting electrode GCE1 and may be connected to a first node N1 through a gate connecting contact hole GCT4.

The scan active layers GACT may overlap the scan gate electrodes CGE in the third direction DR3. The scan active layers GACT may not overlap the third gate connecting electrodes GCE3 in the third direction DR3.

The scan source electrodes GSE may be disposed on first sides of the scan active layers GACT, for example, on the lower sides of the scan active layers GACT. The scan drain electrodes GDE may be disposed on second sides of the scan active layers GACT, for example, on the upper sides of the scan active layers GACT.

The scan source electrodes GSE may be spaced from the scan drain electrodes GDE, which are adjacent to their respective corresponding scan source electrodes GSE in the second direction DR2. The third gate connecting electrodes GCE3 may be disposed between the scan source electrodes GSE and the scan drain electrodes GDE, which are adjacent to their respective corresponding scan source electrodes GSE in the second direction DR2. The scan source electrodes GSE and the scan drain electrodes GDE may not overlap the third gate connecting electrodes GCE3 in the third direction DR3.

The scan source electrodes GSE may be connected to a source connecting electrode SCE through scan source contact holes GSCT and to a data connecting electrode DCE through scan drain contact holes GDCT.

The source connecting electrode SCE may include a stem source connecting electrode SSE and branch source connecting electrodes BSE. The stem source connecting electrode SSE may extend in the second direction DR2, and the branch source connecting electrodes BSE may extend in the first direction DR1. The scan source electrodes GSE may be connected to the source connecting electrode BSE through scan source contact holes GSCT.

The stem source connecting electrode SSE may be connected to a capacitor connecting electrode CCE through a source connecting contact hole GCT3. The capacitor connecting electrode CCE may extend in the first direction DR1. The capacitor connecting electrode CCE may intersect the second scan line SL2, the first horizontal power supply line HVSL, the first node N1, the second horizontal power supply line HVDL, and the second scan line SL2. The capacitor connecting electrode CCE may be connected to an output connecting line SOCL, which is connected to a scan signal output unit SOT through an output contact hole OCT. The capacitor connecting electrode CCE may be connected to a first scan capacitor electrode GCAE1 through a capacitor contact hole CACT.

The first scan capacitor electrode GCAE1 may overlap a second scan capacitor electrode GCAE2, which is connected to the fourth gate connecting electrode GCE4, in the third direction DR3. A first scan capacitor SC1 may be formed by the first and second scan capacitor electrodes GCAE1 and GCAE2.

The data connecting electrode DCE may include a stem drain connecting electrode SDE and branch drain connecting electrodes BDE. The stem drain connecting electrode SDE may extend in the second direction DR2, and the branch drain connecting electrodes BDE may extend in the first direction DR1. The branch source connecting electrodes BSE and the branch drain connecting electrodes BDE may be alternately arranged in the second direction DR2. The scan drain electrodes GDE may be connected to the branch drain connecting electrodes BDE through the scan drain contact holes GDCT.

The stem drain connecting electrode SDE may be connected to a clock connecting electrode CKCE through a drain connecting contact hole GCT2. The clock connecting electrode CKCE may intersect the second scan line SL2 and the first horizontal power supply line HVSL. The clock connecting electrode CKCE may be connected to a scan clock connecting line CKCL, which is connected to the clock signal input unit CKT, through a clock connecting contact hole GCT1.

Referring to FIG. 12, since the scan source electrodes GSE of the first scan transistor GT1 are connected to their respective corresponding branch source connecting electrodes BSE, and since the scan drain electrodes GDE are connected to their respective corresponding branch drain connecting electrodes DSE, the scan active layers GACT may function as channels. Thus, the first scan transistor GT1 can stably output a clock signal (received from the clock signal input unit CKT) to the scan signal output unit SOUT via multiple channels.

Figure 15:
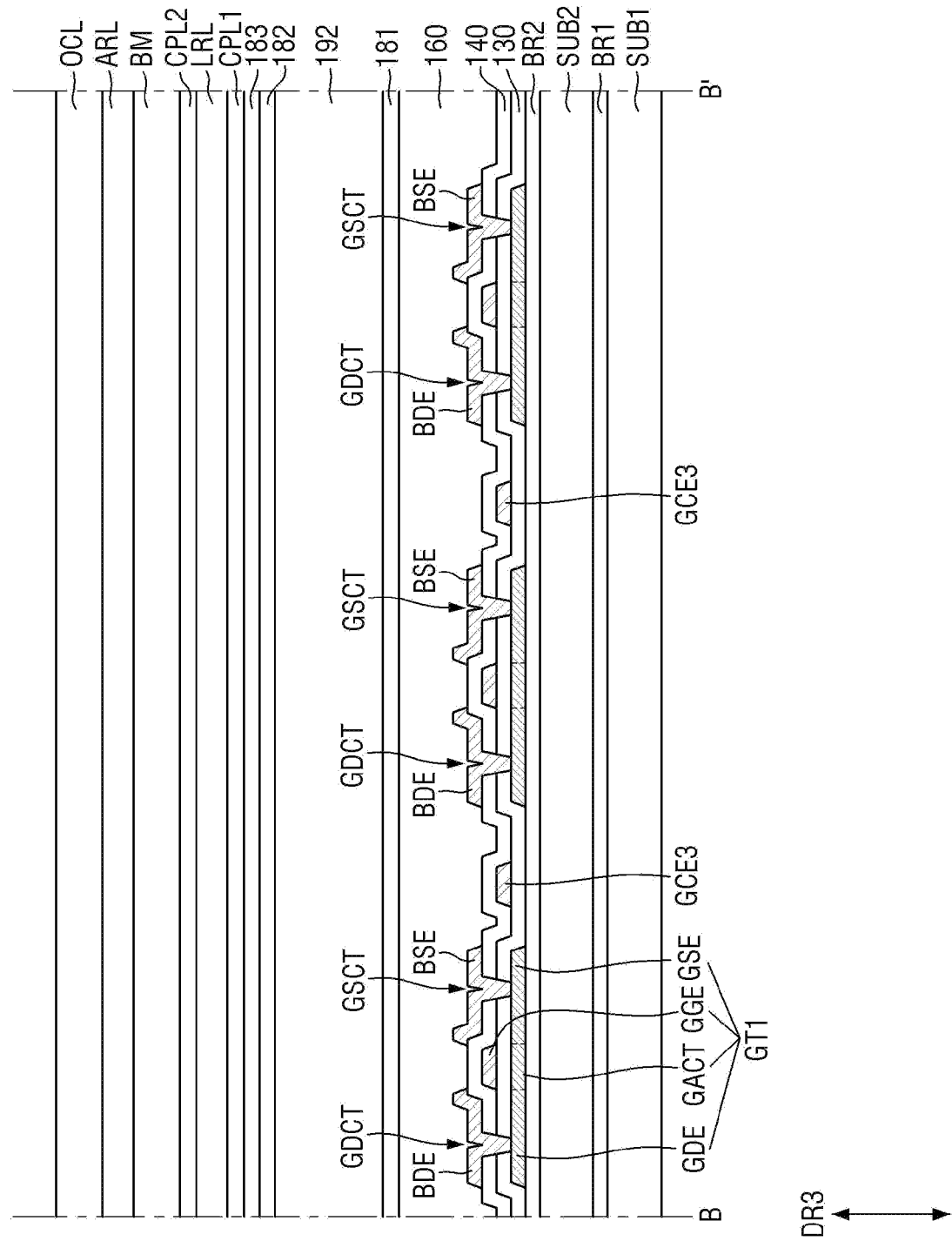
FIG. 15 is a cross-sectional view taken along line B-B' of FIG. 9 according to an embodiment.
Figure 16:
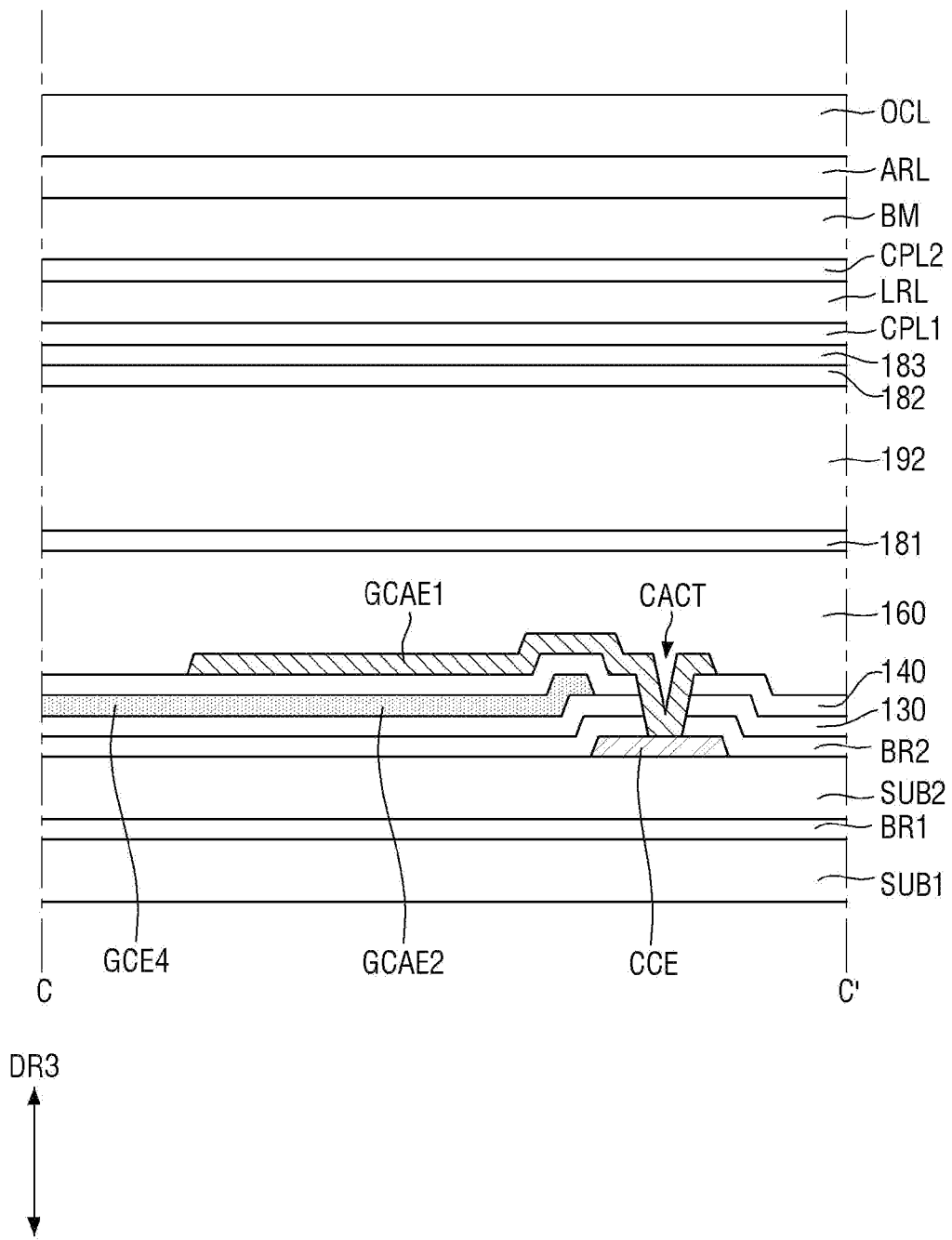
FIG. 16 is a cross-sectional view taken along line C-C' of FIG. 9 according to an embodiment.

FIG. 14 is a cross-sectional view taken along line A-A' of FIG. 9 according to an embodiment. FIG. 15 is a cross-sectional view taken along line B-B' of FIG. 12 according to an embodiment. FIG. 16 is a cross-sectional view taken along line C-C' of FIG. 13 according to an embodiment.

Referring to FIGS. 9, 12, 13, 14, 15, and 16, a first substrate SUB1 may be formed of an insulating material. The first substrate SUB1 may include an organic material such as polyimide.

A first barrier film BR1 may be disposed on the first substrate SUB1. The first barrier film BR1 is a film for protecting the first transistor ST1 and the light-emitting element LE from moisture that may penetrate through the first substrate SUB1, which may be susceptible to moisture. The first barrier film BR1 may include at least one inorganic film. The first barrier film BR1 may be a multifilm in which inorganic films including at least two of $SiO_x$, $SiN_x$, and SiON are alternately stacked.

A second substrate SUB2 may be disposed on the first barrier film BR1. The second substrate SUB2 may be formed of an insulating material. The second substrate SUB2 may include an organic material such as polyimide.

A first metal layer, which includes a first power supply line VSL, a second power supply line VDL, and the second sub-electrode CE22 of the second electrode CE2 of the capacitor CST, may be disposed on the second substrate SUB2. The first metal layer may further include a data line DL and a sensing line SNL. The first metal layer may further include the capacitor connecting electrode CCE and the clock connecting electrode CKCE. The first metal layer may be a single film or a multifilm including one of molybdenum (Mo), aluminum (Al), chromium (Cr), gold (Au), titanium (Ti), nickel (Ni), neodymium (Nd), copper (Cu), and an alloy thereof.

A second barrier film BR2 may be disposed on the first metal layer. The second barrier film BR2 is a film for protecting the first transistor ST1 and the light-emitting element LE from moisture that may penetrate through a second substrate SUB2, which is susceptible to moisture. The second barrier film BR2 may include at least one inorganic film. The second barrier film BR2 may be a multifilm in which inorganic films including at least one of $SiO_x$, $SiN_x$, and SiON are alternately stacked.

A semiconductor layer may be disposed on the second barrier film BR2. The semiconductor layer may include the first active layer ACT1, the first source electrode SE1, and the first drain electrode DE1 of the first transistor ST1 and may include the scan active layers GACT, the scan source electrodes GSE, and the scan drain electrodes GDE of the first scan transistors GT1, The semiconductor layer may further the second active layer ACT2, the second source electrode SE2, and the second drain electrode DE2 of the second transistor ST2. The semiconductor layer may further include the third active layer ACT3, the third source electrode SE3, and the third drain electrode DE3 of the third transistor ST3. The first drain electrode DE1 may be connected to the second power supply line VDL through the first drain contact hole DDT1, which penetrates the second barrier film BR2.

The semiconductor layer may include polycrystalline silicon, monocrystalline silicon, low-temperature polycrystalline silicon, amorphous silicon, or an oxide semiconductor. The first source electrode SE1, the first drain electrode DE1, the scan source electrodes GSE, and the scan drain electrodes GDE may be obtained by doping a silicon semiconductor or an oxide semiconductor with ions or impurities and may thus have conductivity. The first active layer ACT1 may overlap the first gate electrode GE1 in the third direction DR3, which is the thickness direction of the first or second substrate SUB1 or SUB1, and the first source electrode SE1 and the first drain electrode DE1 may not overlap the first gate electrode GE1 in the third direction DR3. The scan active layers GACT may overlap the scan gate electrodes GGE in the third direction DR3, and the scan source electrodes GSE and the scan drain electrodes GDE may not overlap the scan gate electrodes GGE in the third direction DR3.

A gate insulating film 130 may be disposed on the semiconductor layer. The gate insulating film 130 may include an inorganic film of, for example, silicon oxide ($SiO_x$), silicon nitride ($SiN_x$), or silicon oxynitride (SiON).

A second metal layer, which includes the first gate electrode GE1 of the first transistor ST1, the first electrode CE1 of the capacitor CST, the scan gate electrodes SGE of the first scan transistor GT1, and the second scan capacitor electrode GACE2 of the first scan capacitor GC1, may be disposed on the gate insulating film 130. The second metal layer may further include the second gate electrode GE2 of the second transistor ST2, the third gate electrode GE3 of the third transistor ST3, and the gate connecting electrodes GCE. The second metal layer may be a single film or a multifilm including one of Mo, Al, Cr, Au, Ti, Ni, Nd, Cu, and an alloy thereof.

An interlayer insulating film 140 may be disposed on the second metal layer. The interlayer insulating film 140 may include an inorganic film, such as a film of $SiO_x$, $SiN_x$, or SiON.

A third metal layer may be disposed on the interlayer insulating film 140. The third metal layer may include the anode connecting electrode ANDE, the first sub-electrode CE21 of the second electrode CE2 of the capacitor CST, the source connecting electrode SCE, the data connecting electrode DCE, and the first scan capacitor electrode GCAE1 of the first scan capacitor GC1. The third metal layer may further include the first horizontal power supply line HVSL, the second horizontal power supply line HVDL, the first and second scan lines SL1 and SL2, the data connecting electrode DCE, and the connecting electrode BE1. The third metal layer may further include the scan clock connecting line CKCL and the output connecting line SOCL.

The anode connecting electrode ANDE may be connected to the first source electrode SE1 through the first source contact hole SST1, which penetrates the gate insulating film 130 and the interlayer insulating film 140. The third metal layer may be a single film or a multifilm including one of Mo, Al, Cr, Au, Ti, Ni, Nd, Cu, and an alloy of some of the metals.

A planarization film 160, which is for planarizing height differences formed by the first transistor ST1, may be disposed on the third metal layer. The planarization film 160 may be an organic film including an acrylic resin, an epoxy resin, a phenolic resin, a polyamide resin, or a polyimide resin.

A first light-emitting unit PEU1 may be disposed on the planarization film 160. The first light-emitting unit PEU1 may include the pixel electrode 171, a common electrode 173, a first contact electrode 174, a second contact electrode 175, and the light-emitting element LE.

The pixel electrode 171, the common electrode 173, and first bank 192 may be disposed on the planarization film 160.

The first banks 191 may be disposed in an opening OA defined by second banks 192. The light-emitting element LE may be disposed between two adjacent first banks 191. Each of the first banks 191 may have a bottom surface that contacts the planarization film 160, a top surface opposite the bottom surface, and side surfaces between the top surface and the bottom surface. Each of the first banks 191 may have a trapezoidal shape in a cross-sectional view of the display device.

A first bank 191 may include organic films including a photosensitive resin, an acrylic resin, an epoxy resin, a phenolic resin, a polyamide resin, or a polyimide resin. A first bank 191 may be formed of a photosensitive resin such as positive photoresist or negative photoresist.

The pixel electrode 171 and the common electrode 173 may be disposed on the planarization film 160 and first banks 191. The pixel electrode 171 and the common electrode 173 may be spaced from each other and may be electrically isolated from each other.

The pixel electrode 171 may be disposed on at least one side surface and the top surface of a first bank 191. The pixel electrode 171 may be connected to the connecting electrode ANDE through an anode contact hole ANCT, which penetrates the planarization film 160. The common electrode 173 may be disposed on at least one side surface and the top surface of another first bank 191.

The pixel electrode 171 and the common electrode 173 may include a conductive material with high reflectance. The pixel electrode 171 and the common electrode 173 may include a metal such as silver (Ag), Cu, or Al. Accordingly, light emitted from the light-emitting element LE and traveling toward the pixel electrode 171 or the common electrode 173 may be reflected by the pixel electrode 171 or the common electrode 173 and may thus travel above the light-emitting element LE.

A first insulating film 181 may be disposed on the pixel electrode 171 and the common electrode 173. The first insulating film 181 may contact parts of the planarization film 160 that are exposed by the pixel electrode 171 and the common electrode 173. The first insulating film 181 may include an inorganic film, such as a film of $SiO_x$, $SiN_x$, or SiON.

The second banks 192 may be disposed on the first insulating film 181. The second banks 192 may define the opening OA. The second banks 192 may not overlap the first banks 191. A second bank 192 may have a bottom surface that contacts the first insulating film 181, a top surface opposite to the bottom surface, and side surfaces between the top surface and the bottom surface. A second bank 192 may have a trapezoidal shape in a cross-sectional view of the display device.

A second bank 192 may be an organic film including a photosensitive resin, an acrylic resin, an epoxy resin, a phenolic resin, a polyamide resin, or a polyimide resin. A first bank 192 may be formed of a photosensitive resin. A second bank 192 may be formed of positive photoresist or negative photoresist.

The light-emitting element LE may be disposed on the first insulating film 181. The light-emitting element LE may be an inorganic semiconductor element. The light-emitting element LE may have a rod, wire, cylinder, or tube shape. The light-emitting element LE may have a polyhedral shape, such as the shape of a regular cube or a rectangular parallelepiped. The light-emitting element LE may have a polygonal column shape, such as the shape of a hexagonal column. The light-emitting element LE may have a truncated cone shape, may extend in one direction, and may have an inclined outer surface. The light-emitting element LE may have a length in a range of 1 μm to 10 μm, 2 μm to 6 μm, or 3 μm to 5 μm. The light-emitting element LE may have a diameter in a range of 300 nm to 700 nm and may have an aspect ratio in a range of 1.2 to 100.

A second insulating film 182 may be disposed on the light-emitting element LE. The second insulating film 182 may also be disposed on the second banks 192. The second insulating film 182 may include an inorganic film, such as, a film of $SiO_x$, $SiN_x$, or SiON.

The first contact electrode 174 may be connected to the pixel electrode 171 through a first contact hole CCT1, which penetrates the first insulating film 181. The first contact hole CCT1 may expose one of the first banks 191. The first contact electrode 174 may contact a first end of the light-emitting element LE. Accordingly, the first end of the light-emitting element LE may be electrically connected to the pixel electrode 171 via the first contact electrode 174. The first contact electrode 174 may be disposed on the second insulating film 182.

A third insulating film 183 may be disposed on the first contact electrode 174. The third insulating film 183 may cover the first contact electrode 174 to electrically isolate the first and second contact electrodes 174 and 175. The third insulating film 183 may also cover parts of the second insulating film 182 on the second banks 192. The third insulating film 183 may include an inorganic film, such as a film of $SiO_x$, $SiN_x$, or SiON.

The second contact electrode 175 may be connected to the common electrode 173 through a second contact hole CCT2, which penetrates the first insulating film 181. The second contact hole CCT2 may expose one of the first banks 191. The second electrode 175 may contact a second end of the light-emitting element LE. Accordingly, the second end of the light-emitting element LE may be electrically connected to the common electrode 173 via the second contact electrode 175. The second contact electrode 175 may be disposed on the third insulating film 183.

The first and second contact electrodes 174 and 175 may be formed of a transparent conductive oxide (TCO), such as indium tin oxide (ITO) or indium zinc oxide (IZO). Light emitted from the light-emitting element LE may not be significantly blocked by the first and second contact electrodes 174 and 175.

The first end of the light-emitting element LE may be electrically connected to the source electrode SE1 of the first transistor ST1 via the first contact electrode 174 and the pixel electrode 171, and the second end of the light-emitting element LE may be electrically connected to a first power supply line VSL via the second contact electrode 175 and the common electrode 173. Thus, the light-emitting element LE may emit light in accordance with a current that flows from the first end of the light-emitting element LE to the second end of the light-emitting element LE.

A first wavelength conversion layer QDL1 may be disposed in the first subpixel SPX1, a second wavelength conversion layer may be disposed in the second subpixel SPX2, and a transparent insulating film may be disposed in the third subpixel SPX3. Light-emitting elements LE of each of the first, second, and third subpixels SPX1, SPX2, and SPX3 may emit third-color light. The third-color light may be short-wavelength light having a central wavelength in a range of 370 nm to 490 nm, such as blue light or ultraviolet (UV) light.

The first wavelength conversion layer QDL1 may convert third-color light emitted from the light-emitting elements LE of the first subpixel PX1 into first-color light. The first-color light may be red light having a central wavelength in a range of 600 nm to 750 nm.

The second wavelength conversion layer may convert third-color light emitted from the light-emitting elements LE of the second subpixel PX2 into second-color light. The second-color light may be green light having a central wavelength in a range of 480 nm to 560 nm.

Each of the first wavelength conversion layer QDL1 and the second wavelength conversion layer may include a base resin, a wavelength shifter, and a scatterer.

The base resin may include a material having a high light transmittance and an excellent dispersion property for the wavelength shifter and the scatterer. The base resin may include an organic material, such as an epoxy resin, an acrylic resin, a cardo resin, or an imide resin.

The wavelength shifter may convert or shift the wavelength of incident light. The wavelength shifter may be/include quantum dots, quantum rods, or a phosphor. The quantum-dot size of the first wavelength conversion layer QDL1 may be different from the quantum-dot size of the second wavelength conversion layer.

The scatterer may scatter incident light in random directions substantially without changing the wavelength of light passing through the first wavelength conversion layer QDL1 or the second wavelength conversion layer. Accordingly, the path of light passing through the first wavelength conversion layer QDL1 or the second wavelength conversion layer can be lengthened, and as a result, the color conversion efficiency of the wavelength shifter can be improved. The scatterer may be light-scattering particles. The scatterer may be particles of a metal oxide, such as titanium oxide ($TiO_2$), silicon oxide ($SiO_2$), zirconium oxide ($ZrO_2$), aluminum oxide ($Al_2O_3$), indium oxide ($In_2O_3$), zinc oxide (ZnO), or tin oxide ($SnO_2$). The scatterer may be particles of an organic material, such as an acrylic resin or a urethane resin.

The transparent insulating film may transmit short-wavelength light, such as blue light or UV light. The transparent insulating film may be an organic film having high transmittance. The transparent insulating film may be an organic film including a photosensitive resin, an acrylic resin, an epoxy resin, a phenolic resin, a polyamide resin, or a polyimide resin.

The first wavelength conversion layer QDL1 may be disposed on the second contact electrode 175 and the third insulating film 183 of the first subpixel SPX1. The arrangement of the second wavelength conversion layer may be analogous to the arrangement of the first wavelength conversion layer QDL1 in the first subpixel SPX1.

A low-refractive index film LRL may be disposed on the first wavelength conversion layer QDL1, the second wavelength conversion layer, and the transparent insulating film. The low-refractive index film LRL may have a lower refractive index than the base resin of the first wavelength conversion layer QDL1, the base resin of the second wavelength conversion layer, and the transparent insulating film. The low-refractive index film LRL may be an organic film including a photosensitive resin, an acrylic resin, an epoxy resin, a phenolic resin, a polyamide resin, or a polyimide resin. Further, a first capping layer CPL1 is disposed below the low-refractive index film LRL and a second capping layer CPL2 is disposed on the low-refractive index film LRL. The first capping layer CPL1 and the second capping layer CPL2 include an inorganic film of, for example, silicon oxide (SiOx), silicon nitride (SiNx), or silicon oxynitride (SiON).

A first color filter CF1, a second color filter, a third color filter, and a black matrix BM may be disposed on the low-refractive index film LRL.

The first color filter CF1 may overlap the first wavelength conversion layer QDL1 in the third direction DR3. The first color filter CF1 may transmit first-color light, for example, red-wavelength/color light. Thus, short-wavelength light that is emitted from the light-emitting elements LE of the first subpixel PX1 and fails to be converted into first-color light may not pass through the first color filter CF1. First-color light obtained by the first wavelength conversion layer QDL1 from the short-wavelength light emitted from the light-emitting elements LE of the first subpixel PX1 may pass through the first color filter CF1.

The second color filter may overlap the second wavelength conversion layer in the third direction DR3. The second color filter may transmit second-color light, for example, green-wavelength/color light. Thus, short-wavelength light that is emitted from the light-emitting elements LE of the second subpixel PX2 and fails to be converted into second-color light may not pass through the second color filter. Second-color light obtained by the second wavelength conversion layer from the short-wavelength light emitted from the light-emitting elements LE of the second subpixel PX2 may pass through the second color filter.

The third color filter may overlap the transparent insulating film in the third direction DR3. The third color filter may transmit third-color light, for example, blue-wavelength/color light. Thus, short-wavelength light emitted from the light-emitting elements LE of the third subpixel PX3 may pass through the third color filter.

Sections of the black matrix BM may be disposed between the first color filter CF1 and the second color filter, between the first color filter CF1 and an adjacent third color filter, and between the second color filter and the third color filter. The black matrix BM may cover the edges of the first color filter CF1, the edges of the second color filter, and the edges of the third color filter. The black matrix BM may include a light-blocking material capable of blocking the transmission of light. The black matrix BM may include an organic black pigment or an inorganic black pigment such as carbon black.

An anti-reflection layer ARL may be disposed on the first color filter CF1, the second color filter, the third color filter, and the black matrix BM. The anti-reflection layer ARL may include a first inorganic film, a second inorganic film, and an organic film between the two inorganic films. The second inorganic film may overlap the first inorganic film, and the first and second inorganic films may include different materials. The first inorganic film may include SiON, and the second inorganic film may include $SiO_x$. Light reflected from the interface between the first inorganic film and the organic film and light reflected from the interface between the organic film and the second inorganic film can offset each other. Thus, decrease in the visibility of an image that may be potentially caused by the reflection of external light can be reduced by the anti-reflection layer ARL. The anti-reflection layer ARL may be optional. The anti-reflection layer ARL may be replaced by a polarizing film, which may be disposed on an overcoat layer OCL.

The overcoat layer OCL may be disposed on the anti-reflection layer ARL and may be a planarization layer. The overcoat layer OCL may be an organic film including an acrylic resin, an epoxy resin, a phenolic resin, a polyamide resin, or a polyimide resin.

Elements of the first scan transistor GT1 and the first scan capacitor GC1 may be disposed directly on the same layers as and formed of the same materials as elements of the first transistor TR1 and the capacitor CST of the first subpixel SPX1. Advantageously, the first scan transistor GT1 and the first scan capacitor GC1 can be formed without an additional process.

Figure 17:
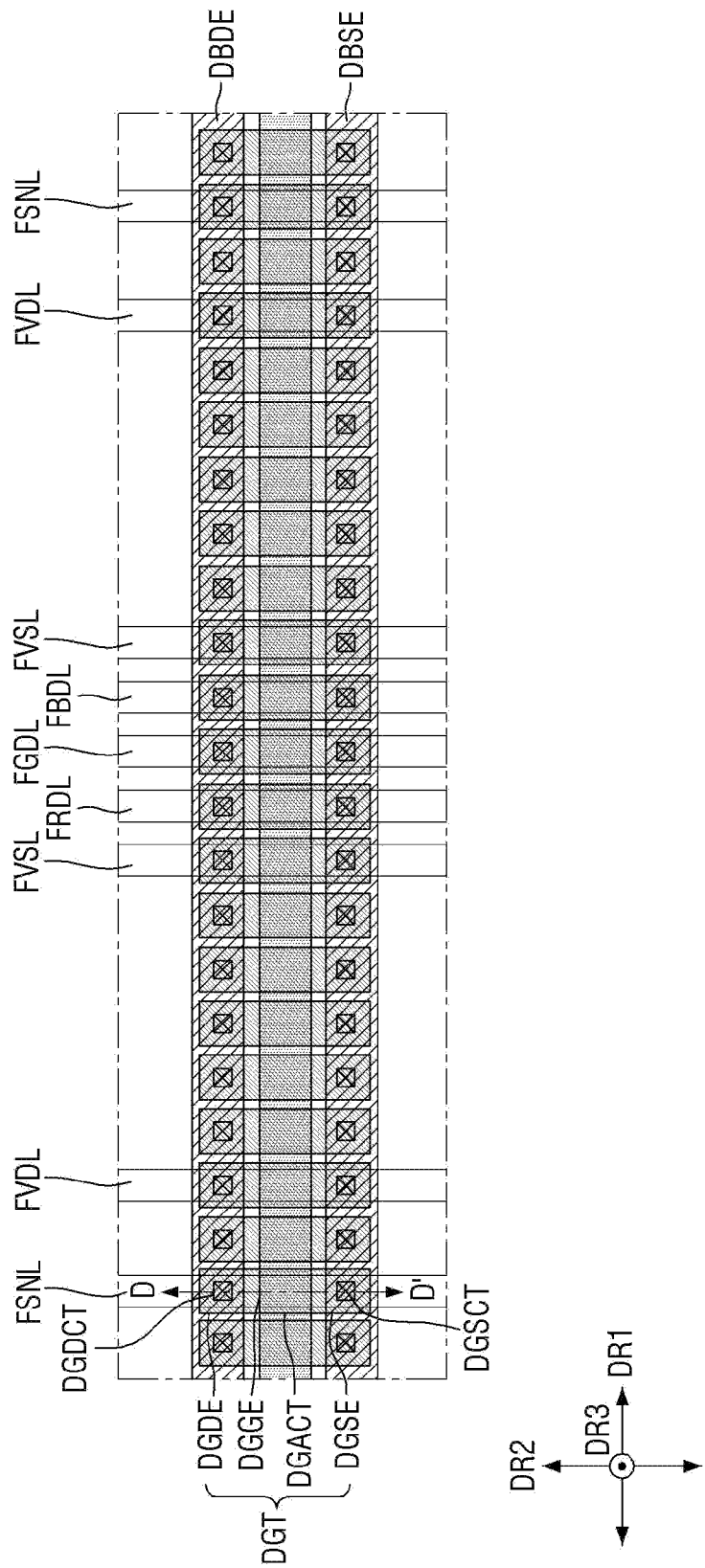
FIG. 17 is a layout view illustrating a dummy transistor of a first dummy stage in a first non-display area according to an embodiment.
Figure 18:
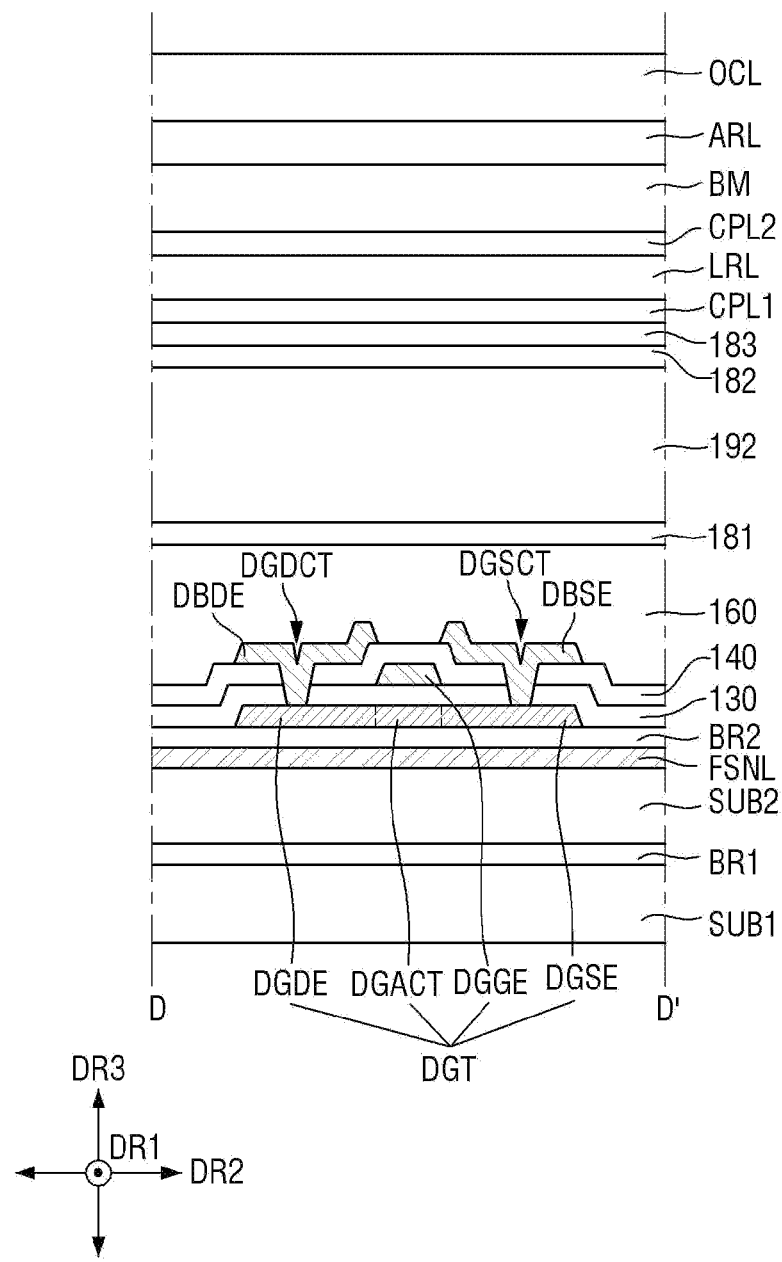
FIG. 18 is a cross-sectional view taken along line D-D' of FIG. 17 according to an embodiment.

FIG. 17 is a layout view illustrating dummy transistors of a first dummy stage in a first non-display area according to an embodiment. FIG. 18 is a cross-sectional view taken along line D-D' of FIG. 17 according to an embodiment. FIG. 17 illustrates an example of the first dummy stage DST1 of FIG. 7.

Referring to FIGS. 17 and 18, as a first dummy stage DST1 is analogous to the m-th stage STAm of FIG. 6, dummy transistors DGT of the first dummy stage DST1 may correspond to one of the first through thirteenth scan transistors GT1 through GT13 of FIG. 6.

The dummy transistors DGT may be connected between a dummy source connecting line DBSE and a dummy drain connecting line DBDE. The dummy source connecting line DBSE and the dummy drain connecting line DBDE may extend in the first direction DR1.

The dummy transistors DGT may include dummy gate electrodes DGGE, dummy source electrodes DGSE, dummy drain electrodes DGDE, and dummy active layers DGACT.

The dummy gate electrodes DGGE may be one integrated/connected dummy gate electrode DGGE that extends in the first direction DR1. The dummy gate electrodes DGGE may be disposed directly on a gate insulating film 130. The dummy gate electrodes DGGE may be part of the second metal layer described above with reference to FIGS. 14 through 16.

The dummy active layers DGACT (or dummy channels DGACT) may overlap the dummy gate electrodes DGGE in the third direction DR3. The dummy active layers DGACT may not substantially overlap the dummy source connecting line DBSE and the dummy drain connecting line DBDE in the third direction DR3.

The dummy source electrodes DGSE may be disposed on first sides of the dummy active layers DGACT, for example, on the lower sides of the dummy active layers DGACT. The dummy drain electrodes DGDE may be disposed on second sides of the dummy active layers DGACT, for example, on the upper sides of the dummy active layers DGACT. The dummy source electrodes DGSE, the dummy active layers DGACT, and the dummy drain electrodes DGDE may be arranged in the second direction DR2.

Each pair of adjacent dummy source electrodes DGSE in the first direction DR1 may be spaced from each other. Each pair of adjacent dummy drain electrodes DGGE in the first direction DR1 may be spaced from each other.

The dummy source electrodes DGSE, the dummy drain electrodes DGDE, and the dummy active layers DGACT may be disposed directly on a second barrier film BR2. The dummy source electrodes DGSE, the dummy drain electrodes DGDE, and the dummy active layers DGACT may be part of the semiconductor layer described above with reference to FIGS. 14 through 16.

The dummy source connecting line DBSE may be connected to the dummy source electrodes DGSE through dummy source contact holes DGSCT, which penetrate a gate insulating film 130 and an interlayer insulating film 140. The dummy drain connecting line DBDE may be connected to the dummy drain electrodes DGDE through dummy drain contact holes DGDCT, which penetrate the gate insulating film 130 and the interlayer insulating film 140. The dummy active layers DGACT may be channels. Thus, the dummy transistors DGT can stably connect the dummy source connecting line DBSE and the dummy drain connecting line DBDE through multiple channels.

The dummy source connecting line DBSE and the dummy drain connecting line DBDE may be disposed directly on an interlayer insulating film 140. The dummy source connecting line DBSE and the dummy drain connecting line DBDE may be part of the third metal layer described above with reference to FIGS. 14 through 16.

A plurality of fan-out/connection lines may be disposed in a first non-display area NDA1. The fan-out lines may include sensing fan-out lines FSNL, first power supply fan-out lines FVSL, second power supply fan-out lines FVDL, and data fan-out lines FRDL, FGDL, and FBDL.

The sensing fan-out lines FSNL connect sensing lines SNL and sensing pads of the first non-display area NDA1. First ends of the sensing fan-out lines FSNL may be connected to sensing lines SNL, and second ends of the sensing fan-out lines FSNL may be connected to the sensing pads of the first non-display area NDA1.

The first power supply fan-out lines FVSL connect first power supply lines VSL and first power supply pads of the first non-display area NDA1. First ends of the first power supply fan-out lines FVSL may be connected to the first power supply lines VSL, and second ends of the first power supply fan-out lines FVSL may be connected to the first power supply pads.

The second power supply fan-out lines FVDL connect second power supply lines VDL and second power supply pads of the first non-display area NDA1. First ends of the second power supply fan-out lines FVDL may be connected to the second power supply lines VDL, and second ends of the second power supply fan-out lines FVDL may be connected to the second power supply pads.

The data fan-out lines FRDL, FGDL, and FBDL may include red data fan-out lines FRDL, which connect red data lines RDL and red data pads of the first non-display area NDA1, may include green data fan-out lines FGDL, which connect green data lines GDL and green data pads of the first non-display area NDA1, and may include blue data fan-out lines FBDL, which connect blue data lines BDL and blue data pads of the first non-display area NDA1. First ends of the red data fan-out lines FRDL may be connected to the red data lines RDL, and second ends of the red data fan-out lines FRDL may be connected to the red data pads of the first non-display area NDA1. First ends of the green data fan-out lines FGDL may be connected to the green data lines GDL, and second ends of the green data fan-out lines FGDL may be connected to the green data pads of the first non-display area NDA1. First ends of the blue data fan-out lines FBDL may be connected to the blue data lines BDL, and second ends of the blue data fan-out lines FBDL may be connected to the blue data pads of the first non-display area NDA1.

The sensing fan-out lines FSNL, the first power supply fan-out lines FVSL, the second power supply fan-out lines FVDL, the red data fan-out lines FRDL, the green data fan-out lines FGDL, and the blue data fan-out lines FBDL may include sections that extend in a second direction DR2 (and may include sections that are oblique relative to the second direction DR2). Accordingly, the sensing fan-out lines FSNL, the first power supply fan-out lines FVSL, the second power supply fan-out lines FVDL, the red data fan-out lines FRDL, the green data fan-out lines FGDL, and the blue data fan-out lines FBDL may intersect the dummy source connecting line DBSE and the dummy drain connecting line DBDE.

The sensing fan-out lines FSNL, the first power supply fan-out lines FVSL, the second power supply fan-out lines FVDL, the red data fan-out lines FRDL, the green data fan-out lines FGDL, and the blue data fan-out lines FBDL may overlap at least some of the dummy transistors DGT in the third direction DR3. Specifically, the sensing fan-out lines FSNL, the first power supply fan-out lines FVSL, the second power supply fan-out lines FVDL, the red data fan-out lines FRDL, the green data fan-out lines FGDL, and the blue data fan-out lines FBDL may overlap the dummy gate electrodes DGGE, the dummy source electrodes DGSE, the dummy active layers DGAT, and the dummy drain electrodes DGDE of the overlapped dummy transistors DGT in the third direction DR3. The sensing fan-out lines FSNL, the first power supply fan-out lines FVSL, the second power supply fan-out lines FVDL, the red data fan-out lines FRDL, the green data fan-out lines FGDL, and the blue data fan-out lines FBDL may intersect the dummy gate electrodes DGGE (or the integrated dummy gate electrode DGGE) of the dummy transistors DGT.

The sensing fan-out lines FSNL, the first power supply fan-out lines FVSL, the second power supply fan-out lines FVDL, the red data fan-out lines FRDL, the green data fan-out lines FGDL, and the blue data fan-out lines FBDL may be disposed directly on a second substrate SUB2. The sensing fan-out lines FSNL, the first power supply fan-out lines FVSL, the second power supply fan-out lines FVDL, the red data fan-out lines FRDL, the green data fan-out lines FGDL, and the blue data fan-out lines FBDL may be part of the first metal layer described above with reference to FIGS. 14 through 16.

While embodiments have been described as examples, various changes may be made to the described embodiments without departing from the scope defined by the following claims.

What is claimed is:

1. A display device comprising:
   a display panel including a display area and a non-display area, wherein the display area includes scan lines, data lines, and pixels electrically connected to the scan lines and the data lines, wherein the non-display area abuts the display area and includes data connection lines, and wherein the data connection lines are respectively electrically connected to the data lines; and
   a scan driving unit including scan stages and auxiliary stages, wherein the scan stages are disposed on the display area and the non-display area and are electrically connected to the scan lines for providing scan signals through the scan lines to the pixels, wherein the auxiliary stages are disposed on the non-display area, include auxiliary transistors, and are for providing carry signals to one or more of the scan stages,
   wherein at least one stage of the scan stages is disposed in the non-display area and not in the display area,
   remaining stages of the scan stages are disposed in the display area and not in the non-display area,
   each of the stages receives a start signal or an input carry signal,
   each of the stages outputs a carry signal and a scan signal,
   each of the scan stages includes a first scan transistor, a clock terminal, a first node, and a first scan capacitor, wherein the clock terminal receives a first clock signal, wherein the first scan transistor outputs the first clock signal to one of the scan lines in accordance with a voltage of a first node, and wherein the first scan capacitor is disposed between a gate electrode of the first scan transistor and a source electrode of the first scan transistor,
   the first scan transistor of a first scan stage among the scan stages is disposed between two adjacent pixels in a first direction, and wherein the first scan capacitor of the first scan stage is disposed between other two adjacent pixels in the first direction, and
   the first scan transistor of the first scan stage is aligned with the first scan capacitor of the second scan stage in a second direction different from the first direction.

2. The display device of claim 1, wherein the auxiliary transistors share an auxiliary gate electrode, and wherein the auxiliary gate electrode intersects the data connection lines.

3. The display device of claim 2, wherein the auxiliary gate electrode and the scan lines extend lengthwise in a first direction, and wherein the data connection lines extend lengthwise in a second direction different from the first direction.

4. The display device of claim 2, further comprising:
   an auxiliary source connecting line; and
   an auxiliary drain connecting line, wherein the auxiliary transistors include auxiliary source electrodes and auxiliary drain electrodes, wherein the auxiliary source electrodes are spaced from each other and are connected to the auxiliary source connecting line through auxiliary source contact holes, and wherein the auxiliary drain electrodes are spaced from each other and are connected to the auxiliary drain connecting line through auxiliary drain contact holes.

5. The display device of claim 4, wherein the auxiliary source connecting line, the auxiliary drain connecting line, and the scan lines extend lengthwise in a first direction, and wherein the data connection lines extend lengthwise in a second direction different from the first direction.

6. The display device of claim 4, wherein the auxiliary transistors further include auxiliary channels, and wherein the auxiliary channels overlap the auxiliary gate electrode and are disposed between the auxiliary source electrodes and the auxiliary drain electrodes.

7. The display device of claim 6, wherein the data connection lines overlap some of the auxiliary channels, some of the auxiliary source electrodes, and some of the auxiliary drain electrodes.

8. The display device of claim 1, further comprising:
a circuit board overlapping a first edge of the display panel; and
a source driving circuit disposed on the circuit board,
wherein the auxiliary stages are disposed between the scan stages and the circuit board.

9. The display device of claim 8, wherein the source driving circuit applies a start signal to a first scan stage among the scan stages, wherein the first scan stage is positioned closer to a second edge of the display panel than all other scan stages of the scan driving unit, and wherein the second edge of the display panel is opposite the first edge of the display panel.

10. The display device of claim 8, wherein the scan stages sequentially output the scan signals, starting from the first scan stage.

11. The display device of claim 1, wherein the scan lines extend lengthwise in the first direction, and wherein the data lines extend lengthwise in the second direction.

12. A display device comprising:
a display panel including a display area and a non-display area, wherein the display area includes scan lines, data lines, and pixels electrically connected to the scan lines and the data lines, wherein the non-display area abuts the display area and includes data connection lines, and wherein the data connection lines are respectively electrically connected to the data lines;
a scan driving unit including scan stages and auxiliary stages;
a circuit board overlapping a first edge of the display panel; and
a source driving circuit disposed on the circuit board,
wherein the scan stages are disposed on both of the display area and non-display area and are electrically connected to the scan lines for providing scan signals through the scan lines to the pixels, wherein the auxiliary stages are disposed on the non-display area and are for providing carry signals to one or more of the scan stages, and wherein the auxiliary stages are disposed closer to the circuit board than the scan stages, and
wherein the auxiliary stages include auxiliary transistors, and wherein an auxiliary transistor among the auxiliary transistors is not connected to the data connection lines, and wherein the auxiliary transistor overlaps a data connection line among the data connection lines.

13. The display device of claim 12, wherein the source driving circuit applies a start signal to a first scan stage among the scan stages, wherein the first scan stage is positioned closer to a second edge of the display panel than all other scan stages of the scan driving unit, and wherein the second edge of the display panel is opposite the first edge of the display panel.

14. The display device of claim 12, wherein the scan stages sequentially output the scan signals, starting from the first scan stage.

15. The display device of claim 12, wherein the auxiliary stages include auxiliary transistors, and wherein some of the auxiliary transistors overlap the data connection lines.

16. The display device of claim 15, wherein the auxiliary transistors share an auxiliary gate electrode, and wherein the auxiliary gate electrode intersects the data connection lines.

17. A tiled display device comprising:
display devices; and
seams disposed between the display devices,
wherein each of the display devices includes a display panel and a scan driving unit, wherein the display panel includes a display area and a non-display area, wherein the display area includes scan lines, data lines, and pixels electrically connected to the scan lines and the data lines, wherein the non-display area abuts the display area and includes data connection lines, wherein the data connection lines are respectively electrically connected to the data lines, wherein the scan driving unit includes scan stages and auxiliary stages, wherein the scan stages are disposed on the display area and the non-display area and are connected to the scan lines for providing scan signals through the scan lines to the pixels, wherein the auxiliary stages are disposed on the non-display area, include auxiliary transistors, and are for providing carry signals to one or more of the scan stages, and
wherein at least one stage of the scan stages is disposed in the non-display area and not in the display area,
remaining stages of the scan stages are disposed in the display area and not in the non-display area,
each of the stages receives a start signal or an input carry signal, and
each of the stages outputs a carry signal and a scan signal,
each of the scan stages includes a first scan transistor, a clock terminal, a first node, and a first scan capacitor, wherein the clock terminal receives a first clock signal, wherein the first scan transistor outputs the first clock signal to one of the scan lines in accordance with a voltage of a first node, and wherein the first scan capacitor is disposed between a gate electrode of the first scan transistor and a source electrode of the first scan transistor,
the first scan transistor of a first scan stage among the scan stages is disposed between two adjacent pixels in a first direction, and wherein the first scan capacitor of the first scan stage is disposed between other two adjacent pixels in the first direction, and
the first scan transistor of the first scan stage is aligned with the first scan capacitor of the second scan stage in a second direction different from the first direction.

* * * * *